United States Patent [19]

Underwood et al.

[11] Patent Number: 5,517,506

[45] Date of Patent: May 14, 1996

[54] METHOD AND DATA PROCESSING SYSTEM FOR TESTING CIRCUITS USING BOOLEAN DIFFERENCES

[75] Inventors: Wilburn C. Underwood, Austin, Tex.; Haluk Konuk, Santa Cruz, Calif.; Sungho Kang; Wai-on Law, both of Austin, Tex.

[73] Assignee: Motorola, Inc., Schaumburg, Ill.

[21] Appl. No.: 218,282

[22] Filed: Mar. 28, 1994

[51] Int. Cl.$^6$ .................................................. G06F 11/263
[52] U.S. Cl. ........................ 371/27; 371/21.3; 371/21.5; 364/578
[58] Field of Search ................................ 371/27, 26, 2.1, 371/21.3, 21.5, 23; 395/800, 650, 600; 364/578–580, 715.11

[56] References Cited

U.S. PATENT DOCUMENTS

| | | | |
|---|---|---|---|
| 4,853,928 | 8/1989 | Williams | 371/27 |
| 5,377,201 | 12/1994 | Chakradhar et al. | 371/27 |
| 5,384,720 | 1/1995 | Ku et al. | 364/578 |
| 5,416,719 | 5/1995 | Pribetich | 364/489 |
| 5,434,794 | 7/1995 | Coudert et al. | 364/489 |
| 5,446,652 | 8/1995 | Peterson et al. | 364/578 |

OTHER PUBLICATIONS

A. A. Ismaeel, Testing for Stuck Faults in CMOS Combinational Circuit, IEEE Proceedings–G, vol. 138, No. 2, Apr. 1991, pp. 191–197.

Bhattacharjee et al., Translation of the Problem of Complete Test Set Generation to Pseudo–Boolean Programming, IEEE Transactions on Computers, vol. 40, No. 7 Jul. 1991, pp. 864–867.

Das et al., On Multiple Fault Analysis in Combinational Circuits by Means of Boolean Difference, Proceedings of IEEE, Jan. 5, 1976, pp. 1447–1449.

*Primary Examiner*—Emanuel T. Voeltz
*Assistant Examiner*—Hal D. Wachsman
*Attorney, Agent, or Firm*—Keith E. Witek

[57] ABSTRACT

A test vector generator system (157) and method for generating test vectors for testing integrated circuit speed paths involves accessing both a circuit model (160) and a list of circuit paths (162). A single circuit path, referred to as a selected path, is selected from the paths (162). A set of logic value constraints is set for custom logic blocks, through the use of Boolean differences, and a set of logic value constraints is set for standard logic devices in the selected circuit path. These logical constraints are set to ensure that a proper input-to-output transition, which is used to identify speed path faults, results in response to only two clock cycles. Once logical constraints are set, hazard-free logical values and logical values for both the second test clock cycle and the first test clock cycle are justified. Test vectors are generated in response to the justified values and the test vectors are serially shifted and double-clocked in an integrated circuit or electrical circuit manufactured in accordance with circuit model (160) to determine time delay path faults.

26 Claims, 19 Drawing Sheets

1

METHOD AND DATA PROCESSING SYSTEM FOR TESTING CIRCUITS USING BOOLEAN DIFFERENCES

FIELD OF THE INVENTION

The present invention relates generally to data processing systems, and more particularly, to path delay testing of integrated circuits using Boolean differences.

BACKGROUND OF THE INVENTION

The prior art in path-delay testing dates to 1985, with the definition of a delay model based on path delay faults. This initial paper and several other papers that followed it taught algorithms to generate tests for path-delay faults in combinational logic circuits. Due to the fact that nobody actually produces purely combinational circuits any more, the only way for these algorithms to be applied to a real circuit is essentially to double each memory device in the circuit so that it can store the two patterns (first clock cycle pattern and second clock cycle pattern) required for the path-delay test as completely independent patterns. This would roughly double the size of the memory portion of the circuit (the section 12 of FIG. 1), which no price-competitive manufacturer is willing to do. As a consequence, all these prior combinational logic approaches to path-delay testing remain largely academic exercises which cannot be used in modern integrated circuit design.

Test generation methods that could be applied to path-delay faults in standard scan sequential circuits first began to appear in 1991. These methods were the first to make feasible the path-delay testing of real circuits. Unfortunately, the methods described in all known papers/publications/patents that target standard scan sequential circuits used a simplified logic algebra that did not include hazard-free values. Hazard-free being a logic value that is to remain at the same logic level and is free of a timing glitch. As a consequence, the methods are unable to target robust tests, which means that any tests they generate may be invalidated by timing problems in other parts of the circuit. In other words, by not using hazard-free values a time delay fault may be inaccurately detected when a time delay fault really didn't occur or vice versa, an actual time delay fault could go unreported due to a static timing hazard. A recent testing method claims to be able to generate robust tests for general sequential circuitry, including standard scan sequential circuits. The absence of certain necessary logic values, however, means that this algorithm is defective and may declare a path untestable even when a robust test exists. None of the prior art provides an error-free method for generating robust tests for standard scan sequential circuitry.

Also in the modern integrated circuit industry, the use of the Boolean difference has not been possible in the generation of robust path-delay tests through custom logic blocks whose structure is not specified, due to the fact that any data structure used for Boolean differences requires huge amount of physical memory to represent the Boolean difference data.

SUMMARY OF THE INVENTION

The previously mentioned disadvantages are overcome and other advantages achieved with the present invention. In one form, the present invention comprises a data processing system having a central processing unit (CPU) and a memory system coupled to the CPU by a bus. The memory system is used to store a plurality of binary values wherein the plurality of binary values are accessed by the CPU to selectively store Boolean differences. The Boolean differences are calculated by logically combining product terms of a function data structure and an inverse function data structure and stored in a fixed amount of memory. The Boolean differences, which are stored in the fixed amount of memory, are in accordance with a predetermined test condition wherein all other Boolean differences not being in accordance with the predetermined test condition are not stored in the fixed amount of memory.

In another form, the invention comprises a Boolean difference generator which has medium for parsing, medium for building, medium for storing, and medium for accessing. The medium for parsing being used to parse a logic circuit model in order to identify at least one output statement of the logic circuit model. The output statement indicating a binary logic output of the logic circuit model as a function of a plurality of Boolean variables, wherein the Boolean variables are logically manipulated by at least one logical operator to form at least one product term. The medium for building using the output statement to produce a product term data structure for both the output statement and an inverse function of the output statement. The product term data structure is a binary bit array which identifies the Boolean variables and how they are interrelated to form product terms in both the output statement and an inverse function of the output statement. The medium for storing being used to store in memory a Boolean difference set. The Boolean difference set is used to selectively store a plurality of Boolean differences, which are stored in accordance with a predetermined test condition. A Boolean difference is formed by logically combining a product term from the product term data structure which corresponds to the output statement and a product term from the product term data structure which corresponds to the inverse function of the output statement. The medium for accessing the Boolean difference set is used to aid in testing of the logic circuit.

In yet another form, the invention comprises a method for processing a logic circuit model to allow for testing of a logic circuit which is coupled in accordance with the logic circuit model. The method begins by parsing the logic circuit model to identify at least one output statement of the logic circuit model. The output statement indicating a binary logic output of the logic circuit model as a function of a plurality of Boolean variables, wherein the Boolean variables are logically manipulated by at least one logical operator to form at least one product term. A product term data structure is built for both the output statement and an inverse function of the output statement. The product term data structure is a binary bit array which identifies the Boolean variables and how they are interrelated to form product terms in both the output statement and an inverse function of the output statement. The Boolean difference set is stored in memory, and the storing of the Boolean difference set is performed selectively by selectively storing a plurality of Boolean differences, which are in accordance with a predetermined test condition. The Boolean differences are formed by logically combining a product term from the product term data structure which corresponds to the output statement and a product term from the product term data structure which corresponds to the inverse function of the output statement. The Boolean difference set is used to allow for testing of the logic circuit.

The present invention will be more clearly understood from the detailed description below in conjunction with the accompanying drawings.

Figure 1:
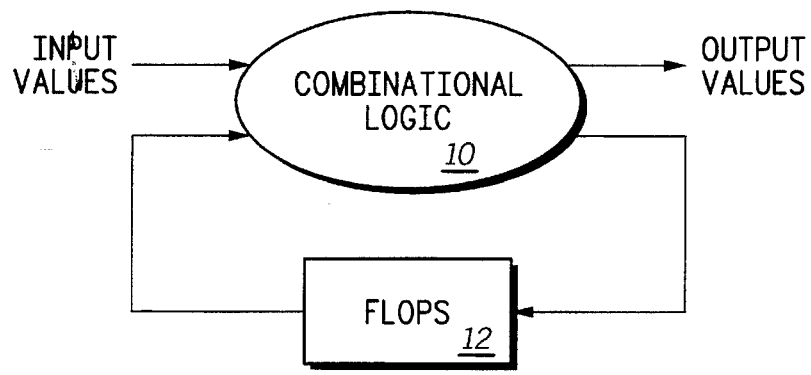
FIG. 1 illustrates, in a block diagram, a circuit which can be path delay tested in accordance with the present invention.

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF A PREFERRED EMBODIMENT

Generally, the present invention provides both a method and an apparatus used to perform robust path-delay testing of an integrated circuit. A circuit path refers to a connected series of elements of an integrated circuit, with the first element in the series referred to as the head of the path and the last element in the series referred to as the tail of the path. A path delay refers to the time required for a logic value change on the head of the path to cause a logic value change on all other elements in the circuit path up to the tail of the path. The speed at which an integrated circuit can work is determined by the largest of the path delays (most time consuming) in the entire integrated circuit. A timing error for such a circuit path is said to have occurred when a path delay exceeds the system clock cycle, which is the amount of time required for the system clock for the integrated circuit to go through one complete period. When a circuit path shows such a timing error, the circuit path is said to possess a path delay fault. A robust test for a path delay fault is a test that guarantees that the circuit response will differ from the expected/passing response whenever the path possesses a path delay fault, regardless of the presence or absence of path delay faults on other circuit paths.

For example, assume that a circuit path comprises a first scannable flip-flop which has an output coupled to an input of an AND gate wherein the AND gate has an output coupled to an input of a second scannable flip-flop. The first and second scannable flip-flops (and any clocked component/circuit in the integrated circuit which contains the first and second scannable flip-flops) are clocked at a predetermined speed by applying a clock signal to the integrated circuit. In order to test this example circuit path, an initial logic value is scanned into a flip-flop preceding the first scannable flip-flop or is provided to an input pin to allow a logic value A to appear on the input of the first scannable flip-flop. This logic value A will not propagate to the output until the first scannable flip-flop is clocked. Also, an initial logic value B is provided at the output of the second scannable flip-flop. Assume for the sake of example that A=0 and B=1, although any combination of values may occur for any type of circuit path.

Various signals are set or predetermined (as discussed herein) along the circuit path to ensure that when A=0 is clocked into the first scannable flip flop via a first clock cycle that the value A=0, when applied down the circuit path, results in B=1 changing to B=0 at a second clock cycle. Therefore, the A=0 has just one clock cycle from the time it is latched into the first scannable flip-flop to propagate down the circuit path and change B from a logic '1' to a logic '0'. If B stays a logic '1' after assertion of the second clock cycle, then the A=0 signal did not propagate through the circuit path in time to affect the second scannable flip-flop. This indicates that the clock speed is too fast for this circuit path (i.e. signals are not arriving at critical clocked inputs before the clocking is occurring). If the signal B is changed to a '0' from a '1' then the circuit path can properly operate at the current clock cycle and under current conditions.

Therefore, for every circuit path in an electrical circuit or integrated circuit, one can determine that a path X is operable up to 47 MHz, path Y is operable up to 113 MHz, and Z is operable up to 80 MHz. This information can then be used to determine what clock speed is maximal for a given circuit or may be used to determine which exact circuit paths need to be redesigned to achieve a higher clock speed for a circuit. For example, if the circuit described above was to run at 60 MHz, path X would be a problem and most likely would require redesign, a new layout, or different manufacturing/processing.

The method of the present invention operates on a circuit model of an integrated circuit (usually a computer simulated model of an integrated circuit) and a database which identifies various circuit paths of this circuit model. The circuit model must be a circuit model in which all circuit memory elements are scannable flip-flops. A circuit path is selected from the set of circuit paths and a set of logic value constraints for elements of the circuit model that are required to achieve a path-delay test are determined. Some of these logic value constraints, referred to as hazard-free logic values, may be required to be free of timing hazards. Logic values which cause these hazard-free logic values to be produced in the circuit model are determined first. Next, logic values to cause logic value constraints for the second clock cycle to be produced in the circuit model are determined. Finally, logic values to cause logic value constraints for the first clock cycle to be produced in the circuit model are determined. A test vector comprises the logic values on input terminals for the integrated circuit and on the scannable flip-flops for the first clock cycle and is generated after all logical values have been set for both clock cycles one and two.

The present invention overcomes many of the disadvantages stated in the background and can be more fully understood with reference to the FIGS. 1–24 herein. In summary, the present invention is a method of generating robust path-delay tests through custom logic blocks whose structure is not specified, by selectively processing a Boolean difference set whose memory constraints are set by software. The custom logic blocks are being represented to the path delay test generation program, FastPath, by means of Boolean equations enumerating all prime implicants (or product terms) of the logic functions realized at the outputs of the block. The internal program representation of these functions is a pair of machine word bit-arrays representing the product terms in a programmable logic array (PLA) format containing the prime implicants for the non-inverted function F and its inverse function F'. The representation of both F and F' enhances the efficiency of the test generation process by allowing the F value of Logic 0 to be set on a custom block output by setting a single prime implicant of F' to Logic 1 (meaning F is zero) rather than by setting all prime implicants of F to Logic 0.

In addition to the enhanced efficiency of setting Logic 0 for the F value of custom block output by using F', the representation of both F and F' also allows the incremental/partial specification of all sensitizing patterns for a particular input-to-output transition through the custom block. Wherein sensitizing patterns are a set of patterns which allow the output transition to occur. All the product terms (i.e., prime implicants) involving the specified input in the non-inverted function F being paired with all product terms involving the specified input in the inverted function F'. This is essentially the Boolean difference of the function F (or F') with respect to the specified input (or its inverse). The Boolean differences can be computed in an incremental/selective fashion by going through the lists of product terms for F and F' in a step-wise fashion and recording the current position of pairs of product terms (one in F and one in F') which produce the proper output transition. This allows the specification of a fixed number of product terms, using a fixed amount of memory defined by the software, for the Boolean difference. This fixed amount of memory allows Boolean differences to be used for modern integrated circuit design, whereas conventional Boolean difference algorithms require too much memory to be practical. In general, a fixed number of product terms in F and F' are processed to produce the fixed number of Boolean differences. The fixed number of Boolean differences is called a Boolean difference set and is processed to determine if any of the Boolean differences in the set are compatible with the current test constraints. If not, then more Boolean differences are derived from other product terms in F and F' until either a working Boolean difference (two paired product terms, one from F and one from F') is found or all product term pairs between F and F' are exhausted. In other words, if a test has proved impossible with the current set of product terms, the next set is generated and tested. If all sets of the product terms fail, then the circuit path is considered to be untestable.

It can also be mentioned that in order to guarantee the robustness of the generated tests, it is necessary to specify steady (hazard-free) values, or logic values for clock cycle two, on all inputs to the custom block other than the one on which a rising or falling transition is to be generated.

FIG. 1 generally illustrates a portion of an integrated circuit having a set of scannable flip-flops 12 (i.e., storage devices) and a combinational logic section 10. FIG. 1 also illustrates input values which may come from other storage devices (i.e. scannable flip-flops) or integrated circuit input terminals (input pins). Output values are provided to storage devices or to external terminals (output pins) of the integrated circuit. A circuit path to be tested in this portion of an integrated circuit could consist of: (1) a connected series of circuit elements beginning with a circuit input terminal, containing at least one of the logic devices in the combinational logic section 10, and ending with an external terminal of the integrated circuit, (2) a connected series of circuit elements beginning with a storage device, containing at least one of the logic devices in the combinational logic section 10, and ending with an external terminal of the integrated circuit, (3) a connected series of circuit elements beginning with a circuit input terminal, containing at least one of the logic devices in the combinational logic section 10, and ending with a storage device, or (4) a connected series of circuit elements beginning with a storage device, containing at least one of the logic devices in the combinational logic section 10, and ending with a storage device.

Although FIG. 1 illustrates a generic type of circuit which may be tested a specific example is most useful in understanding the path delay method discussed herein. FIGS. 2 through 5 illustrate a specific circuit which may be used to determine path delays. The scannable flip-flops 20, 22, and 24 correspond to the set of scannable flip-flops 12 of FIG. 1.

tion for path delay faults. This logic value set is given in TABLE 1 below.

TABLE 1

| LOGIC VALUE | LOGIC VALUE FOR FIRST CLOCK CYCLE | LOGIC VALUE FOR SECOND CLOCK CYCLE | ADDITIONAL INFORMATION |
|---|---|---|---|
| 00 | 0 | 0 | Not guaranteed hazard-free but can be made into S0 |
| 01 | 0 | 1 | Rising transition for path test |
| 0Y | 0 | Y | Y represents both Z and signals constrained to X |
| 0X | 0 | X | Can be made into S0 |
| 10 | 1 | 0 | Falling transition for path test |
| 11 | 1 | 1 | Not guaranteed hazard-free but can be made into S1 |
| 1Y | 1 | Y | Y represents both Z and signals constrained to X |
| 1X | 1 | X | Can be made into S1 |
| Y0 | Y | 0 | Y represents both Z and signals constrained to X |
| Y1 | Y | 1 | Y represents both Z and signals constrained to X |
| YY | Y | Y | Y represents both Z and signals constrained to X |
| YX | Y | X | Y represents both Z and signals constrained to X |
| X0 | X | 0 | Can be made into S0 |
| X1 | X | 1 | Can be made into S1 |
| XY | X | Y | Y represents both Z and signals constrained to X |
| XX | X | X | Can be made into S0 or S1 |
| S0 | 0 | 0 | Guaranteed hazard-free |
| S1 | 1 | 1 | Guaranteed hazard-free |
| SZ | Z | Z | Guaranteed hazard-free |
| 00T | 0 | 0 | Cannot be made into S0 |
| 0XT | 0 | X | Cannot be made into S0 |
| X0T | X | 0 | Cannot be made into S0 |
| XT0 | X | X | Cannot be made into S0 |
| 11T | 1 | 1 | Cannot be made into S1 |
| 1XT | 1 | X | Cannot be made into S1 |
| X1T | X | 1 | Cannot be made into S1 |
| XT1 | X | X | Cannot be made into S1 |
| XTB | X | X | Cannot be made into S0 or S1 |

Figure 2:
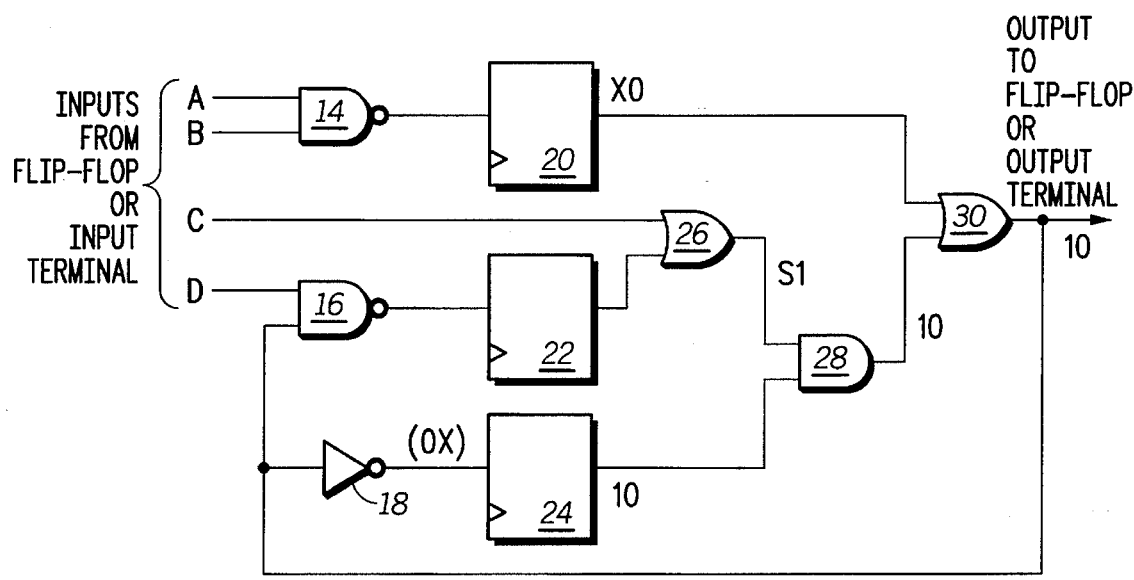
FIG. 2–5 illustrate, in block diagrams, a specific circuit which may be path delay tested and how test logic values are determined within the specific circuit in accordance with the present invention.

The combinational logic devices 14, 16, 18, 26, 28, and 30 correspond to the combinational logic section 10 of FIG. 1. The example of a circuit path to be tested in this circuit is the path beginning with scannable flip-flop 24, the head of the path, containing combinational logic devices 28 and 30, and ending at the output to a scannable flip-flop or output terminal, the tail of the path. A test for a path delay fault on this circuit path must first establish the initial value on the head of the path, scannable flip-flop 24 (an initial value being output from flip-flop 24 which may be serially scanned into 24). After a first clock cycle, the first time interval in which the system clock for the integrated circuit goes through one complete period following the establishment of the initial value on the head of the path, the second value for the head of the path has been clocked into the storage element from the input (from inverter 18). After a second clock cycle, the second time interval in which the system clock for the integrated circuit goes through one complete period following the establishment of the initial value on the head of the path, the response value for the tail of the path has either been clocked into a storage element flip-flop or simply provided to the output terminal as indicated in FIG. 1. FIG. 2 illustrates the logic values that are necessary on the inputs and outputs of circuit devices on the example path in order to achieve a robust test of the example circuit path. These logic values are selected from the logic value set that has been designed to be used for test genera- For example, a logic value 10 (see the Output of FIG. 2) represents a value that is logic 1 during the first clock cycle and logic 0 during the second clock cycle, the logic value S1 represents a value that is logic 1 for both the first and second clock cycles and is free of any static timing hazard during these two clock cycles, logic value X0 represents a value that is logic 0 for the second clock cycle but whose logic value is not specified (a don't care) for the first clock cycle, and logic value 0X represents a value that is logic 0 for the first clock cycle but whose logic value is not specified for the second clock cycle. Since scannable flip-flop 24 has a value of logic '0' during the second clock cycle, the INVERTER 18 must input a value of logic '0' to the flip-flop 24 during the first clock cycle so that the system clock will cause this logic value '0' to be latched into the scannable flip-flop 24 during the second clock cycle, which is the reason that the logic value 0X has been listed as a required logic value for the INVERTER 18. If the path is functional at the operating speed, the Output of FIG. 2 will be initially '1' on the first clock cycle and latched as a '0' on the second clock cycle as indicated by the 10 label on the Output in FIG. 2.

Figure 3:
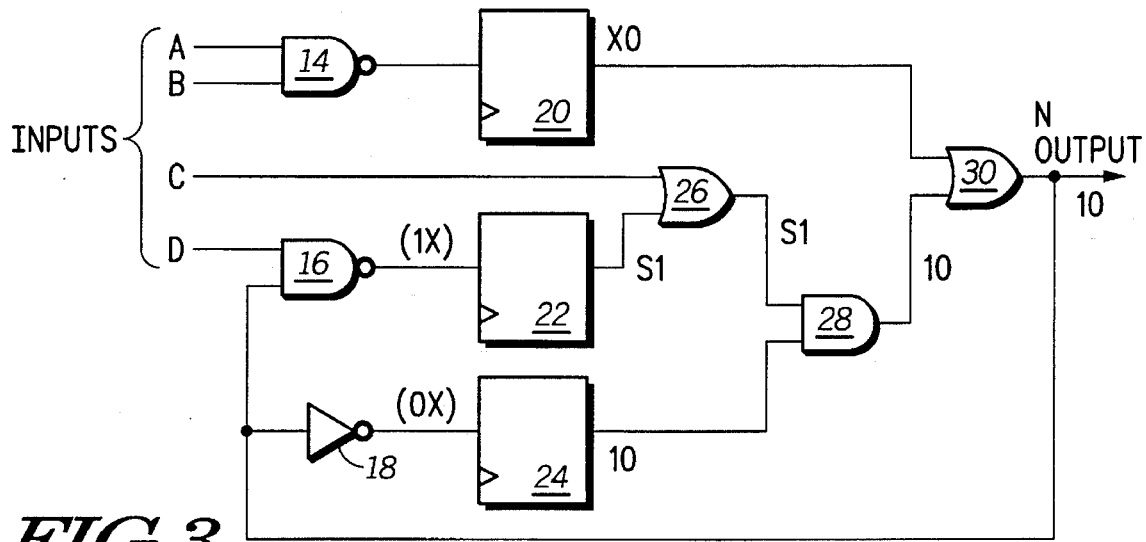

FIG. 3 illustrates the state of the circuit after justifying all the hazard-free logic values from FIG. 2. Justifying a logic value refers to the process of determining logic values in the circuit model, the determined logic values being assigned to circuit input terminals and to scannable flip-flops in such a way as to cause the logic value to be justified to occur in the circuit model and in the integrated circuit manufactured from the model. The only hazard-free value in FIG. 2 is the S1 that is placed on the OR gate 26, so FIG. 3 represents the changes made in the logic values of the circuit as a result of justifying this single hazard-free value. The output of OR 26 must be hazard-free due to the fact that the input from flip-flop 24 is a logical 10.

For example, if one input of the AND gate 28 is 10 (one in the first clock cycle and zero in the second clock cycle), then the output of OR 26 must be one in the first clock cycle to ensure that the output of AND 28 is a one in the first clock cycle. Furthermore, in the second clock cycle the output of OR 26 must be a one to ensure that the one to zero transition of the output of flip-flop 24 is the only input that alters the output of AND 28 in order to properly measure the selected circuit path. In other words, if the output of OR 26 is ever allowed to be zero even for a timing hazard's short time frame, the path under test is adversely affected and may not result in a proper determination of a path delay fault. The selected path (from flip-flop 24 to the Output) may be incorrectly deemed path delay functional at the given frequency because of a static hazard through gate 26.

In general, a static timing hazard is said to occur when a signal is to remain at the same logic level for some time period but changes to the opposite logic level on a transient basis before returning to its final value. For example, a signal that is to remain at logic 0 for two clock cycles may change briefly (i.e., "spike") to logic 1 at the start of the second clock cycle before settling back to its final value of logic 0.

In order to produce a hazard-free logic 1 (S1 in the logic value set used in this invention) on the output of an OR gate, it is only necessary to have S1 on at least one of the inputs of the OR gate. In this example circuit, we may choose either of two input devices to produce this hazard-free logic 1 and the choice has been arbitrarily made to assign S1 to the scannable flip-flop 22. Since the scannable flip-flop 22 must have logic value 1 during the second clock cycle as a consequence of the definition of the S1 value, the NAND gate 16 must have a value of logic 1 during the first clock cycle so that the system clock will cause this logic value to be latched into the scannable flip-flop 22 for the second clock cycle, which is the reason that the logic value 1X has been listed as a required logic value for the NAND gate 16.

Figure 4:
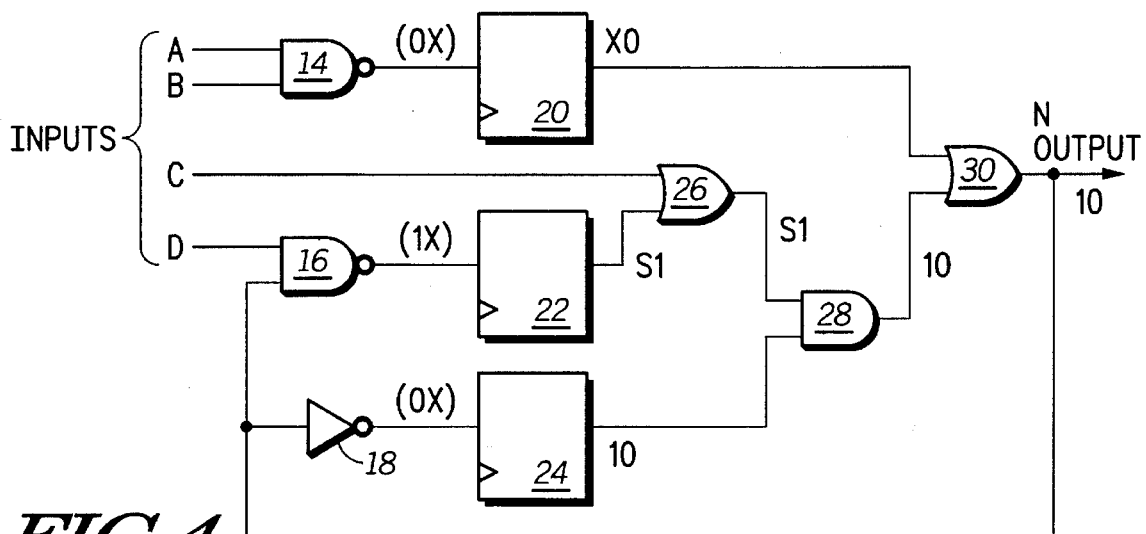

FIG. 4 illustrates the state of the circuit after justifying all the logic values for the second clock cycle from FIG. 3. The only value in FIG. 3 for the second clock cycle is the X0 that is placed on the scannable flip-flop 20, so FIG. 4 represents the changes made in the logic values of the circuit as a result of justifying this single value for the second clock cycle. Since the scannable flip-flop 20 must have logic value 0 during the second clock cycle, the NAND gate 14 must have a value of logic 0 during the first clock cycle so that the system dock will cause this logic value to be latched into the scannable flip-flop 22 for the second clock cycle, which is the reason that the logic value 0X has been listed as a required logic value for the NAND gate 14 in FIG. 4.

Figure 5:
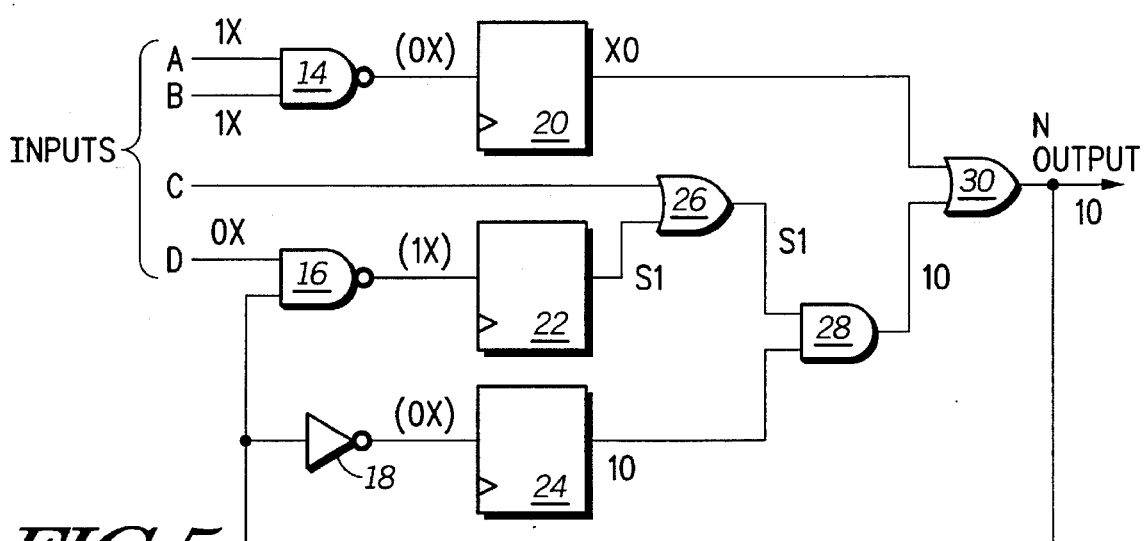

FIG. 5 illustrates the state of the circuit after justifying all the logic values for the first clock cycle from FIG. 4. The values in FIG. 4 for the first clock cycle are the 0X on the output of the NAND gate 14, the 1X on the output of the NAND gate 16, and the 0X on the output of the INVERTER 18. Therefore, FIG. 5 represents the changes made in the logic values of the circuit as a result of justifying these values for the first clock cycle. In order to produce a value of 0X on the NAND gate 14, it is necessary that all its input devices have a value of logic 1 in the first clock cycle, so the two circuit input terminals that are connected to the NAND gate 14 have both been assigned values of 1X. To produce a value of 1X on the NAND gate 16, it is only necessary that one of its input devices have a value of logic 0 for the first clock cycle. Since the input that comes from the OR gate 30 has value 10, it is necessary to assign the 0X value to the circuit input terminal that provides the other input to the NAND gate 16. Finally, to produce a 0X on the INVERTER 18, it is necessary that its input device have a value of logic 1 during the first clock cycle and the OR gate 30, which is the input device for the INVERTER 18, already has a value of logic 1 during the first clock cycle due to the requirement that its output change from logic 1 to logic 0 because it is on the circuit path to be tested. At this point the test vector for the example circuit and example path has been completely generated. The test vector consists of logic 1 during the first clock cycle on the circuit input terminals (both of them) that are connected to the NAND gate 14, logic 0 during the first clock cycle on the circuit input terminal that is connected to the NAND gate 16, logic 1 to be serially shifted into the scannable flip-flop 22 (since the first clock cycle value of logic value S1 is a logic 1) and logic 1 to be serially shifted into the scannable flip-flop 24 (since the first clock cycle value of logic value 10 is a logic 1).

Note that all circuit logic devices on the circuit path to be tested have undergone a transition from logic 1 in the first clock cycle to logic 0 in the second clock cycle, which is called a falling transition. This will not always be the case. One reason for this is that the specification of the test to be produced may require that the head of the path undergo a transition from logic 0 in the first clock cycle to logic 1 in the second clock cycle, which is called a rising transition. A second reason is that some combinational logic devices on the path to be tested may be inverting devices, such as an INVERTER, a NAND gate or a NOR gate. A rising transition on an input to an inverting device will produce a falling transition on the output and a falling transition on the input will produce a rising transition on the output, so some combinational logic devices on the path to be tested may undergo one type of transition while other combinational logic devices on the path undergo the opposite type of transition. Finally, some of the combinational logic devices on the path to be tested may be either inverting or non-inverting, depending on the value of other inputs. For example, a two-input EXCLUSIVE-OR gate will invert an input transition if its other input is S1 but will not invert the transition if its other input is S0. The particular type of transition to be undergone by each of the combinational logic devices on the path to be tested will change the input logic values that are required to achieve a robust test of the path.

Given the example illustrated via FIGS. 2–5, FIG. 6 illustrates a flowchart which describes how a robust speed path test vector is generated for any circuit. In a step 32, a path is selected from the list of paths for which path-delay tests are to be generated. In a step 34, certain required logic values for the path-delay test are determined from the description of the path and the circuit model, and these required values are set as constraints on the state of the circuit model that must be satisfied if a test is to be generated. If a path is found to be untestable in the step 34, then the path is declared untestable in a step 44. The logic value constraints from the step 34 are then justified, in a particular order depending on the type of constraint that is required. The first logic value constraints to be justified are the hazard-free values that are required to be free of timing hazards, which is accomplished in a step 36. If a path is found to be untestable in the step 36, then the path is declared untestable in the step 44. Next, the logic value constraints for the second clock cycle are justified in a step 38, and finally the logic value constraints for the first clock cycle are justified in a step 40. In a step 42, the test generation result is checked to see if values have been successfully determined to justify all the required logic value constraints, and if they have been successfully generated then a test vector is declared to have been generated and is saved as an output result vector in a step 46. If all possible values are tried (implicitly) and it proves impossible to justify all the required logic value constraints, then the selected path is declared to be untestable in the step 44. Only two clock cycles are required for this test because the integrated circuit is required to have scannable flip-flops as memory elements. This means that the first set of values required for the test vector can be serially shifted into the memory elements rather than having to be produced by the functionality of the integrated circuit.

Figure 6:
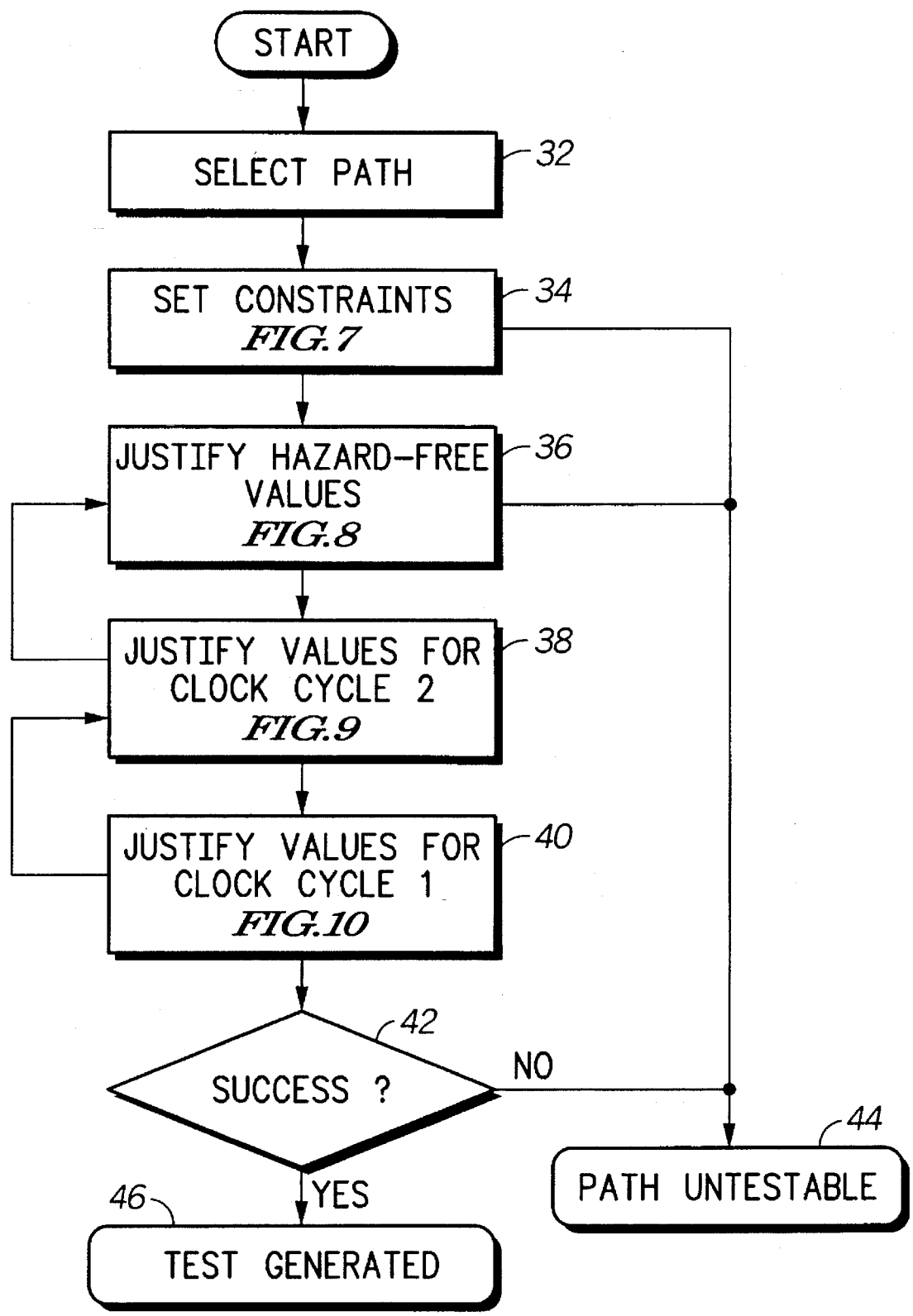
FIG. 6 illustrates, in a flowchart, a method for generating a test vector which is used to test a delay path in an electrical circuit in accordance with the present invention.
Figure 7:
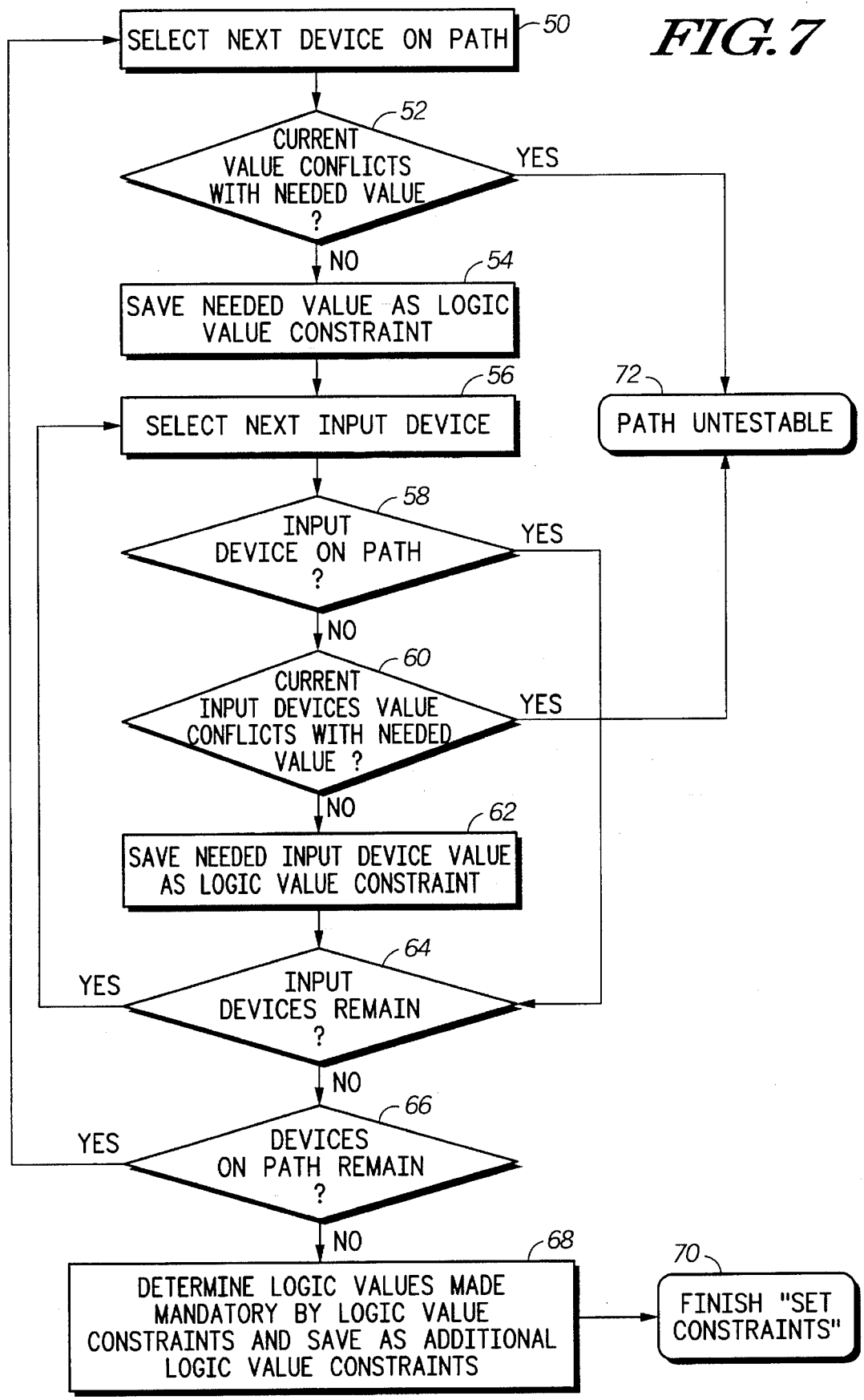
FIG. 7 illustrates, in a flowchart, several specific steps involved when setting logic constraints as illustrated in FIG. 6 in accordance with the present invention.

FIGS. 7–10 illustrate flowcharts wherein each flowchart further explains a step in FIG. 6. FIG. 7 illustrates the flowchart for the step 34 in FIG. 6. First, the next device on the circuit path to be tested is selected in a step 50. The current logic value on this circuit device is checked against the required logic value constraint for the device in a step 52. If the current logic value conflicts with the required logic value constraint, then it is not possible to satisfy the required logic value constraints and the path is declared to be untestable in a step 72. If the current logic value on the circuit device does not conflict with the required logic value constraint, then the required logic value constraint is saved as part of the record for the selected circuit device in a step 54. The next circuit device that is connected to the input pins of the selected circuit device is examined in a step 56. This input device is checked to see if it is on the circuit path to be tested in a step 58. If it is, then no further action is taken on the input device since it will previously have been a selected circuit device in the step 50 and its logic value constraints will already have been saved in the step 54, so flow moves to the step 64.

If the input device is not on the circuit path to be tested, then the current logic value of the input device is checked to see if it conflicts with the required logic value constraints for the input device in a step 60. If the current logic value of the input device does conflict with the required logic value constraint for the input device, then it is not possible to satisfy the required logic value constraints and the path is declared to be untestable in the step 72. If the current logic value of the input device does not conflict with the required logic value constraint for the input device, then in a step 62 the required logic value constraint is saved as part of the record for the input device. In a step 64, the selected circuit device is checked to see if there are other input devices that have not yet been examined and if there are, then the flow returns to the step 56. If there are no more unexamined input devices for the selected circuit device, then in a step 66 the path description is checked to see if there are more circuit devices on the path to be tested that have not yet been selected and if there are, then the flow returns to the step 50.

If there are no more circuit devices on the path to be tested that have not yet been selected, then a step 68 checks the circuit devices with logic value constraints to determine if there are other logic values made mandatory by these logic value constraints and if so, these other mandatory logic values are saved as additional logic value constraints for the circuit model. The step 68 is accomplished by a technique, known as backward implication, which is common to test generation procedures. For example, a value of logic 1 for an AND gate implies (requires) that all input devices for the AND gate also have a value of logic 1. Another example, is that an OR gate having a zero output requires that all inputs have a zero value. Following the step 68, the Set Constraints procedure is exited in a step 70.

Figure 8:
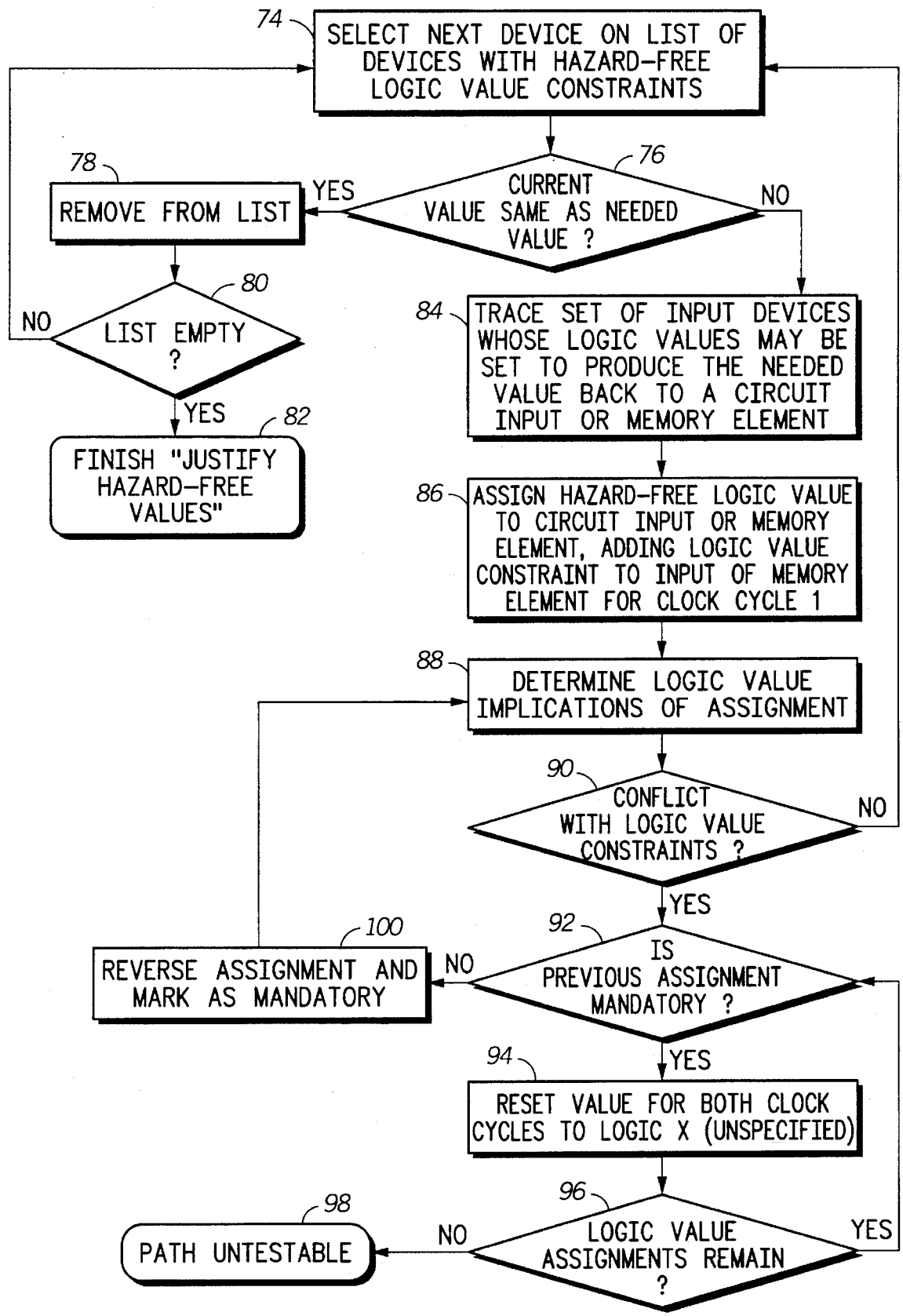
FIG. 8 illustrates, in a flowchart, several specific steps which are involved when justifying hazard-free logic values as illustrated in FIG. 6 in accordance with the present invention.

FIG. 8 illustrates the flowchart for the step 36 in FIG. 6. In a step 74 the next circuit device on the list of devices with hazard-free logic value constraints is selected. The selected circuit device is examined to see if its current logic value is the same as the logic value required by the logic value constraint in a step 76. If the current logic value is not the same as the logic value required by the logic value constraint, then in a step 84 a process of backtracing from the input devices of the selected circuit device is initiated. This process of backtracing consists of selecting an input device whose current logic value (and logic value constraint, if any such exists for this input device) is compatible with the input logic value needed to produce the hazard-free logic value specified by the logic value constraint on the selected logic device. When such an input device is identified, then the backtracing process is applied to the identified input device and this continues iteratively until a circuit input terminal or a scannable flip-flop is encountered. At this point, the hazard-free logic value that is needed to assist in producing the hazard-free logic value on the initially selected circuit device is assigned to the circuit input terminal or scannable flip-flop in a step 86. A step 88 performs a logic simulation to determine the logic value implications of the logic value assignment made in the step 86.

Circuit devices that are simulated are checked for conflict with their logic value constraints in a step 90. If no conflict is determined in the step 90, the flow returns to the step 74. If there is conflict between the current logic value and the logic value constraint for some circuit element in the step 90, then a step 92 examines the previous logic value assignment to see if it is a mandatory assignment, i.e., an assignment that is either required to have its present value by some logic value constraint in the circuit model, or has already had the inverse hazard-free value simulated and found to cause conflict. If the previous assignment is not mandatory, then in a step 100 its hazard-free logic value assignment is inverted and marked as mandatory and flow returns to the step 88. If the previous assignment is mandatory, then in a step 94 the circuit input terminal or scannable flip-flop to which the assignment had been made is returned to an unspecified state (logic value X) and the record of the previous logic value assignment is removed from the list of such records.

A step 96 examines the list of records of logic value assignments to see if more records remain on the list. If there are more records on the list, flow returns to the step 92. If there are no more records of logic value assignments on the list, then all possible logic value assignments have been tried and found to produce conflict with required logic value constraints, so the path is declared untestable in a step 98. If the examination in the step 76 reveals that the current logic value is the same as the logic value required by the logic value constraint, then the selected logic device is simply removed from the list of devices with hazard-free logic value constraints in a step 78. A step 80 examines the list of circuit devices with hazard-free logic value constraints to see if the list is empty. If the step 80 reveals that the list is not empty, then flow returns to the step 74. If the step 80 reveals that the list is empty, then the Justify Hazard-free Values procedure is exited in a step 82.

Figure 9:
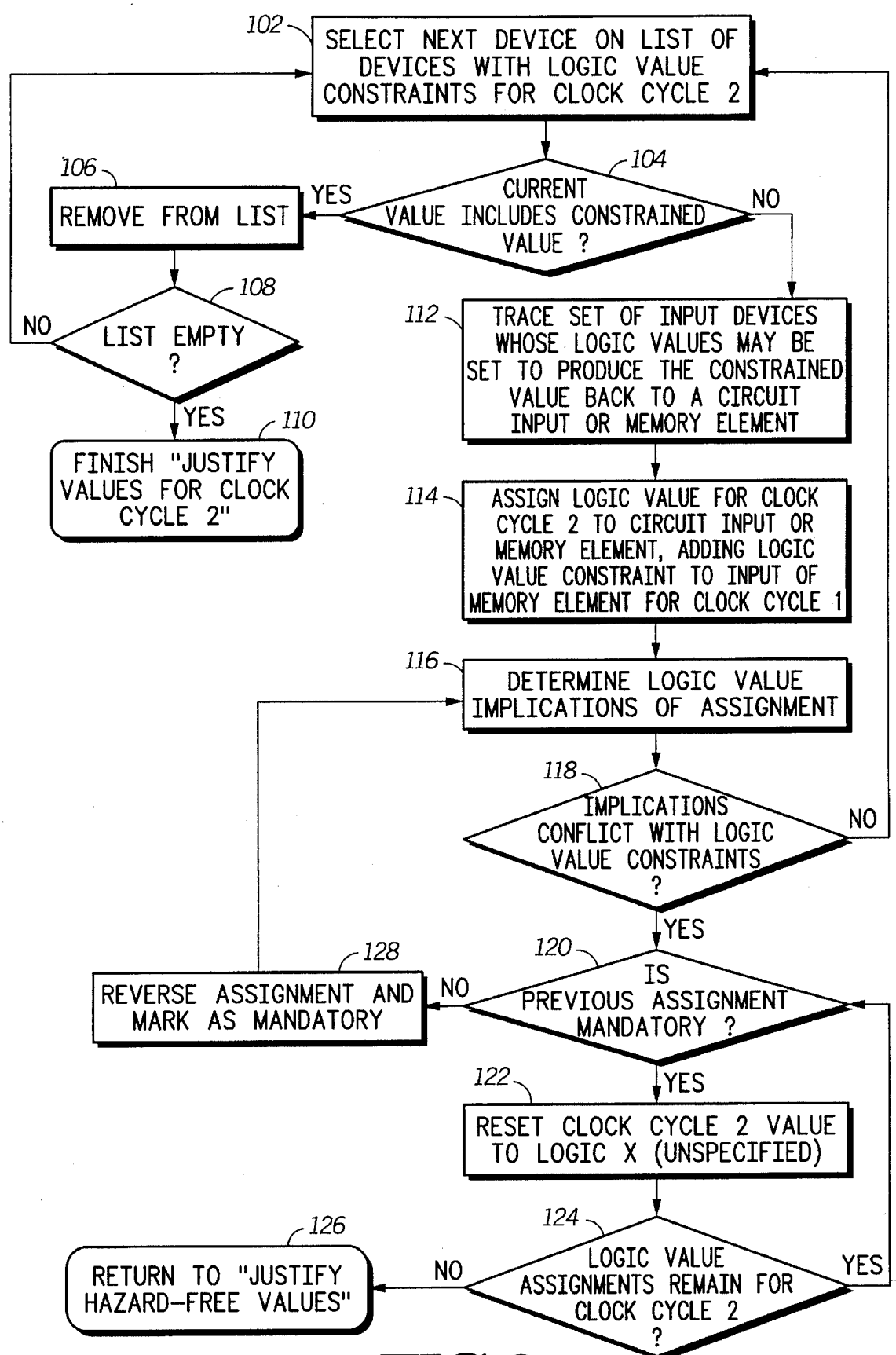
FIG. 9 illustrates, in a flowchart, several specific steps which are involved when justifying values for a second clock cycle as illustrated in FIG. 6 in accordance with the present invention.

FIG. 9 illustrates the flowchart for the step 38 in FIG. 6. A step 102 selects the next circuit device on the list of devices with logic value constraints for the second clock cycle. A step 104 examines the selected circuit device to see if its current logic value includes the logic value required by the logic value constraint. A first logic value is said to include a second logic value if all the requirements for the second logic value are also met by the first logic value. If the current logic value does not include the logic value required by the logic value constraint, then a step 112 initiates a process of backtracing from the input devices of the selected circuit device. This consists of selecting an input device whose current logic value (and logic value constraint, if any such exists for this input device) is compatible with the input logic value needed to produce the value required by the logic value constraint for the second clock cycle on the selected logic device. When such aft input device is identified, then the backtracing process is applied to the identified input device and this continues iteratively until a circuit input terminal or a scannable flip-flop is encountered. At this point, the logic value that is needed to assist in producing the value required by the logic value constraint for the second clock cycle on the initially selected circuit device is assigned to the circuit input terminal or scannable flip-flop in a step 114.

A step 116 performs a logic simulation to determine the logic value implications of the logic value assignment made in the step 114. Circuit devices that are simulated are checked for conflict with their logic value constraints in a step 118. If no conflict is determined in the step 118, the flow returns to the step 102. If there is conflict between the current logic value and the logic value constraint for some circuit element in the step 118, a step 120 examines the previous logic value assignment to see if it is a mandatory assignment, i.e., an assignment that is either required to have its present value by some logic value constraint in the circuit model or has already had the inverse value for the second clock cycle simulated and found to cause conflict. If the previous assignment is not mandatory, then its logic value assignment is inverted and marked as mandatory in a step 128 and flow returns to the step 116. If the previous assignment is mandatory, a step 122 returns the circuit input terminal or scannable flip-flop to which the previous logic value assignment had been made to an unspecified state (logic value X) for the second clock cycle and the record of the previous logic value assignment is removed from the list of such records.

A step 124 examines the list of records of logic value assignments to see if more records remain on the list. If there are more records on the list, flow returns to the step 120. If there are no more records of logic value assignments on the list, then all possible logic value assignments for the second clock cycle have been tried and found to produce conflict with required logic value constraints, so some of the hazard-free assignments made in the step 36 of FIG. 6 have made it impossible to complete the generation of the test vector, so a step 126 returns to the step 36 of FIG. 6 to attempt to find a different assignment of hazard-free values that will allow the successful generation of a test vector. If the step 104 reveals that the current logic value does include the logic value required by the logic value constraint, a step 106 removes the selected logic device from the list of devices with logic value constraints for the second clock cycle. A step 108 examines the list of circuit devices with logic value constraints for the second clock cycle to see if the list is empty. If the step 108 reveals that the list is not empty, then flow returns to the step 102. If the step 108 reveals that the list is empty, then the Justify Values For Clock Cycle 2 procedure is exited in a step 110.

Figure 10:
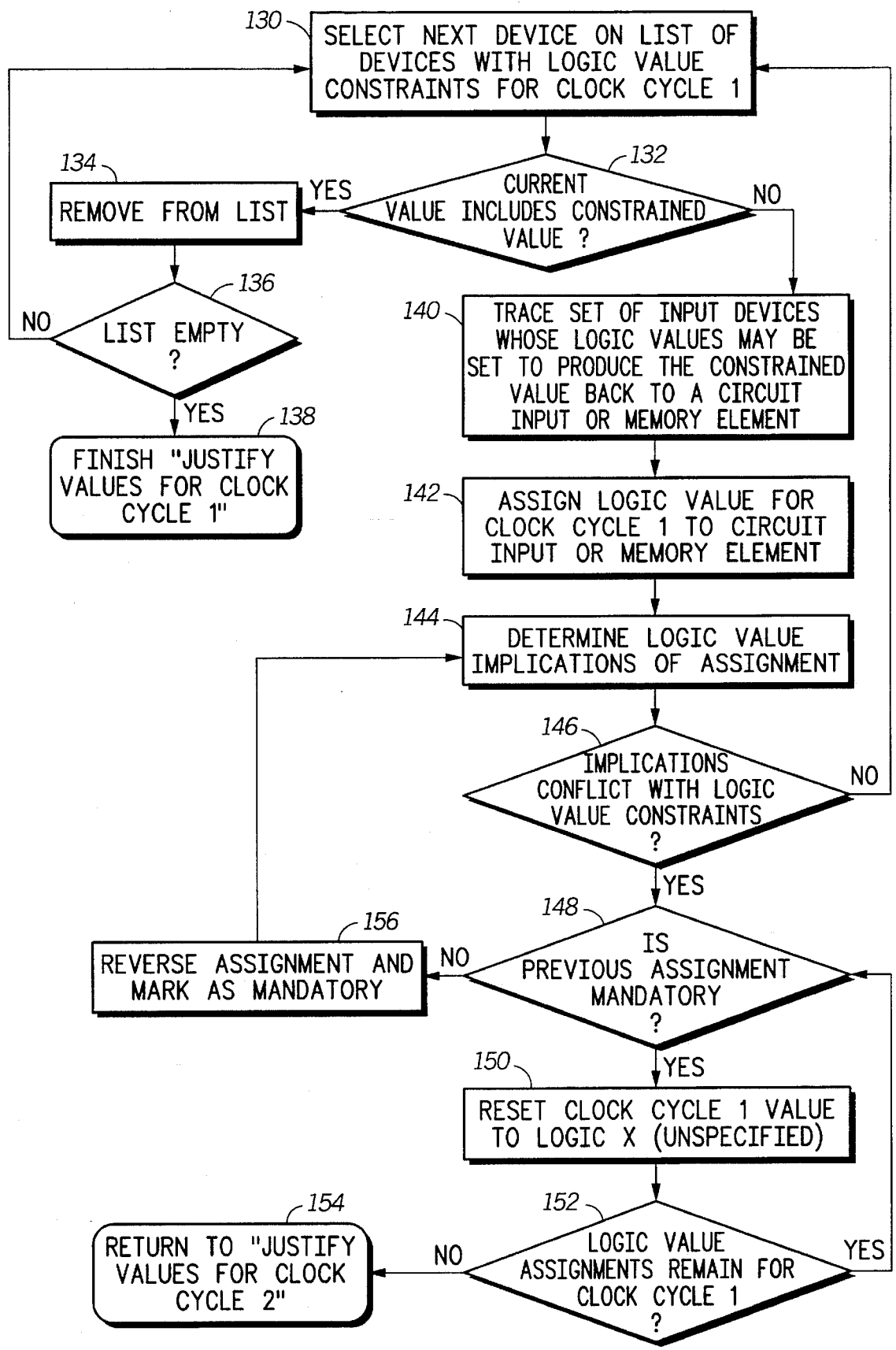
FIG. 10 illustrates, in a flowchart, several specific steps which are involved when justifying values for a first clock cycle as illustrated in FIG. 6 in accordance with the present invention.

FIG. 10 illustrates the flowchart for the step 40 in FIG. 6. A step 130 selects the next circuit device on the list of devices with logic value constraints for the first clock cycle. A step 132 examines the selected circuit device to see if its current logic value includes the logic value required by the logic value constraint. If the current logic value does not include the logic value required by the logic value constraint, then a step 140 initiates a process of backtracing from the input devices of the selected circuit device. This process of backtracing consists of selecting an input device whose current logic value (and logic value constraint, if any such exists for this input device) is compatible with the input logic value needed to produce the value required by the logic value constraint for the first clock cycle on the selected logic device. When such an input device is identified, then the backtracing process is applied to the identified input device and this continues iteratively until a circuit input terminal or a scannable flip-flop is encountered. At this point, the logic value that is needed to assist in producing the logic value required by the logic value constraint for the first clock cycle on the initially selected circuit device is assigned to the circuit input terminal or scannable flip-flop in a step 142. A step 144 performs a logic simulation to determine the logic value implications of the logic value assignment made in the step 142.

Circuit devices that are simulated are checked for conflict with their logic value constraints in a step 146. If no conflict is determined in the step 146, the flow returns to the step 130. If there is Conflict between the current logic value and the logic value constraint for some circuit element in the step 146, a step 148 examines the previous logic value assignment to see if it is a mandatory assignment, i.e., an assignment that is either required to have its present value by some logic value constraint in the circuit model or has already had the inverse logic value for the first clock cycle simulated and found to cause conflict. If the previous assignment is not mandatory, then its logic value assignment for the first clock cycle is inverted and marked as mandatory in a step 156 and flow returns to the step 144. If the previous assignment is mandatory, then the circuit input terminal or scannable flip-flop to which the previous assignment had been made is returned to an unspecified state (logic value X) for the first clock cycle and the record of the previous logic value assignment is removed from the list of such records in a step 150.

A step 152 examines the list of records of logic value assignments to see if more records remain on the list. If there are more records on the list, flow returns to the step 148. If there are no more records of logic value assignments on the list, then all possible logic value assignments for the first clock cycle have been tried and found to produce conflict with requires logic value constraints, so some of the assignments for the second clock cycle made in the step 38 of FIG. 6 have made it impossible to complete the generation of the test vector and a step 154 returns to the step 38 of FIG. 6 to attempt to find a different assignment of values for the second clock cycle that will allow the successful generation of a test vector. If the examination in the step 132 reveals that the current logic value does include the logic value required by the logic value constraint, a step 134 removes the selected logic device from the list of devices with logic value constraints for the first clock cycle. A step 136 examines the list of circuit devices with logic value constraints for the first clock cycle to see if the list is empty. If the step 136 reveals that the list is not empty, then flow returns to the step 130. If the step 136 reveals that the list is empty, then the Justify Values For Clock Cycle 1 procedure is exited in a step 138.

Figure 11:
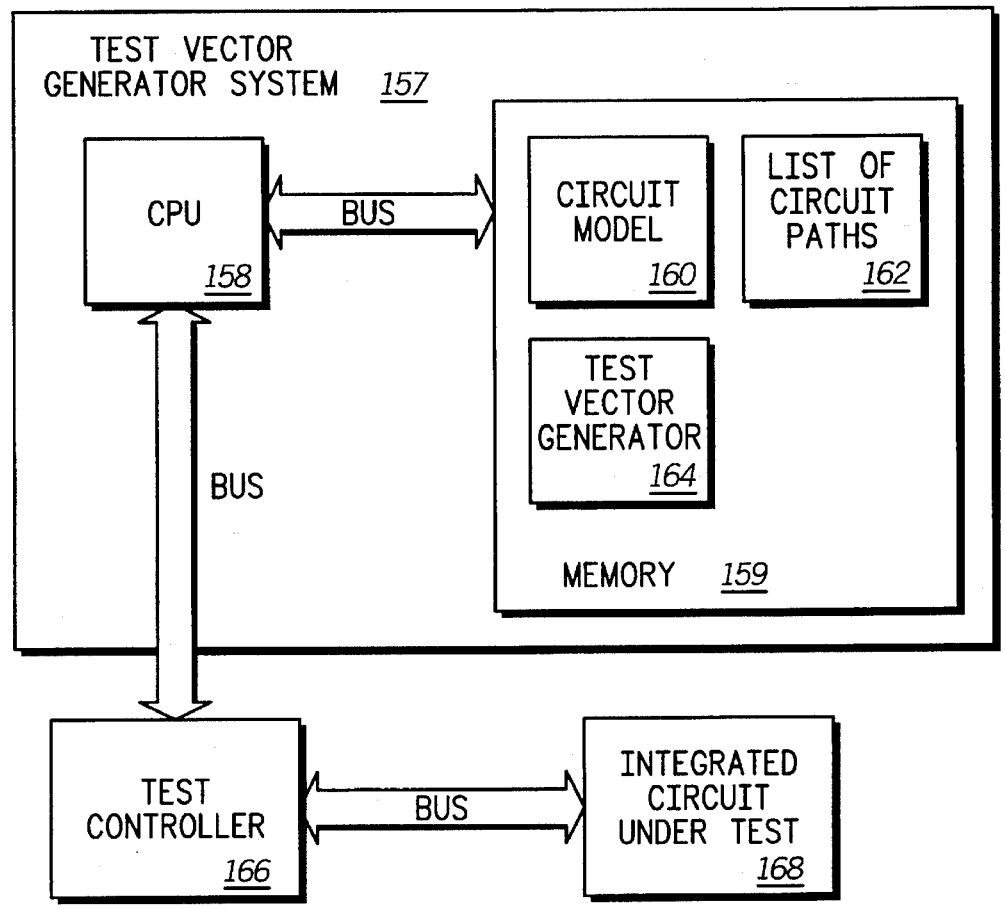
FIG. 11 illustrates, in a block diagram, a data processing system which may be used to path delay test an integrated circuit in accordance with the present invention.

FIG. 11 illustrates a system which may be used to generate speed path test vectors and then speed path test an integrated circuit using the generated test vectors and a test apparatus. FIG. 11 illustrates a central processing unit (CPU) 158, which is coupled to a memory system 159 via a bus. The memory 159 stores a circuit model 160, a list of circuit paths 162, and a test vector generator 164. The CPU 158 executes the generator 164 which accesses the circuit model 160 and the list of circuit paths 162 to generate test vectors, as taught herein, for every testable path in the list of circuit paths 162. These test vectors are then communicated to a test controller 166 which is used to clock and/or provide the test vectors to the integrated circuit under test 168.

The test controller 166 and the link between the test controller 166 and the circuit under test 168 comprise the test apparatus. This providing of test vectors and reading of results by the controller 166 is used to derive delay path and speed path information from the actual integrated circuit 168, and may be performed multiple times with varying clock rates in order to derive more precise speed path information. The test controller to be used here may be any one of several types of devices. One example of a test controller is a production electronic digital tester, such as a Teradyne J971. A second example of a test controller is a laboratory tester such as a Hewlett-Packard 82000. Still another example of a test controller would be a specialized logic device that could be constructed especially to link the Test Vector Generator System 157 to the Integrated Circuit Under Test 168. The Test Vector Generator System 157 could also be any one of several types of systems, such as an engineering workstation, a personal computer, a large mainframe computer, or a multiprocessing supercomputer.

Figure 12:
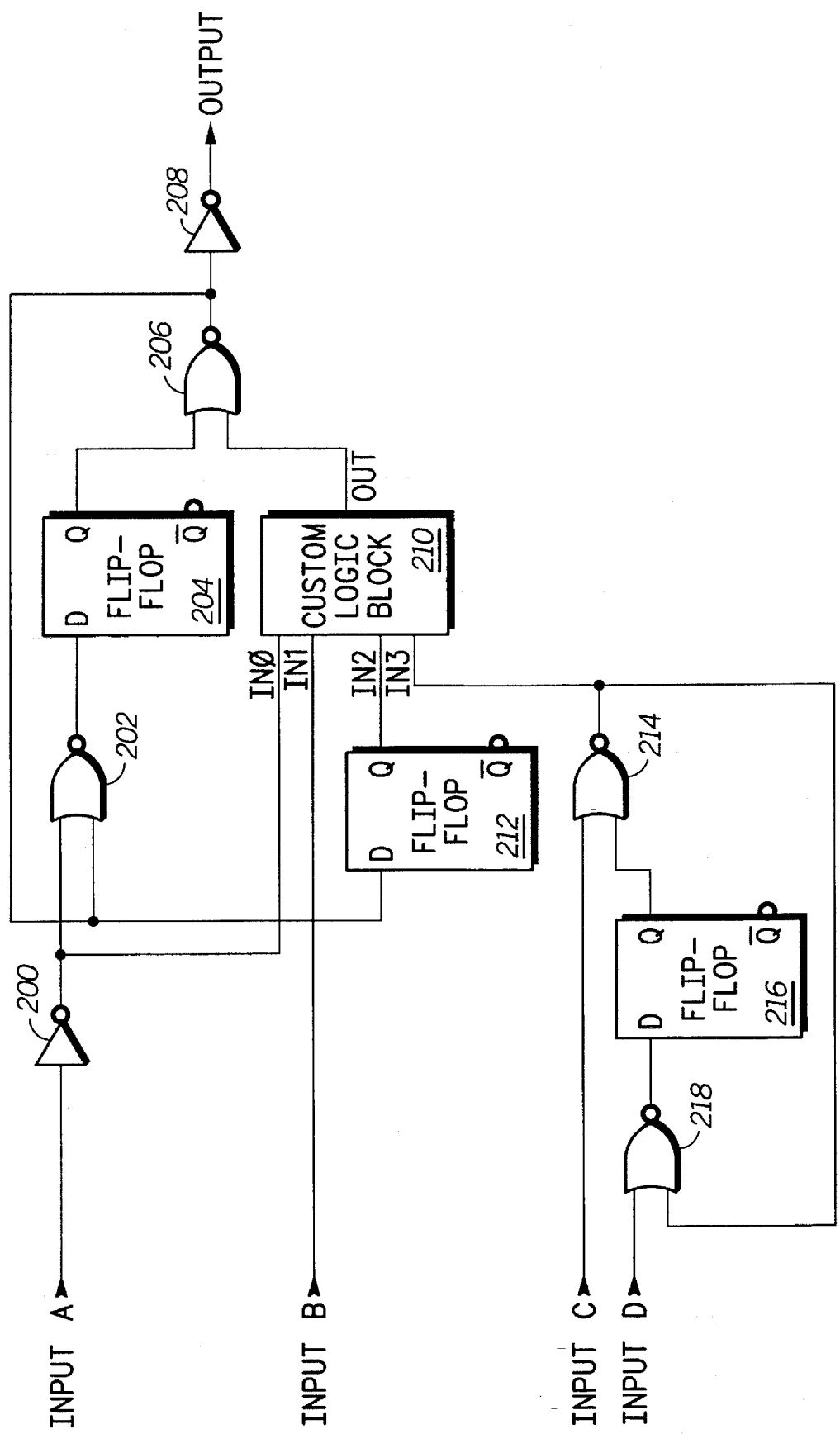
FIG. 12 illustrates, in a block diagram, a circuit that contains a custom logic block, which is a block of elements that is described by its functional equation in accordance with the present invention.

FIG. 12 generally illustrates a portion of an integrated circuit having four inputs A, B, C and D. FIG. 12 also illustrates an inverter 200 having an input A and an output. A NOR gate 202 having an input coupled to the output of inverter 200, a second input, and an output. A scannable flip-flop 204 has an input coupled to the output of the NOR gate 202 and an output. A NOR gate 206 has an input coupled to the output of the scannable flip-flop 204, a second input, and an output. An inverter 208 has an input coupled to the output of a NOR gate 206 and inverter 208 has an output labeled OUTPUT. A custom logic block has one input (IN0) coupled to the output of inverter 200, a second input B (IN1), a third input (IN2), a fourth input (IN3), and an output (OUT) coupled to the second input of NOR gate 206. A scannable flip-flop 212 has an input coupled to the output of inverter 206 and an output coupled to the third input (IN2) of custom logic block 210. A NOR gate 214 has an input C, a second input and an output coupled to the fourth input (IN3) of custom logic block 210. A NOR 218 has an input D, a second input coupled to the fourth input (IN3) of custom logic block, and an output. A scannable flip-flop 216 has an input coupled to the output of NOR gate 218 and an output coupled to the second input of NOR gate 214. The circuit of FIG. 12 will be processed by the Boolean difference algorithm taught herein to provide test vectors to test the circuit of FIG. 12.

Figure 13:
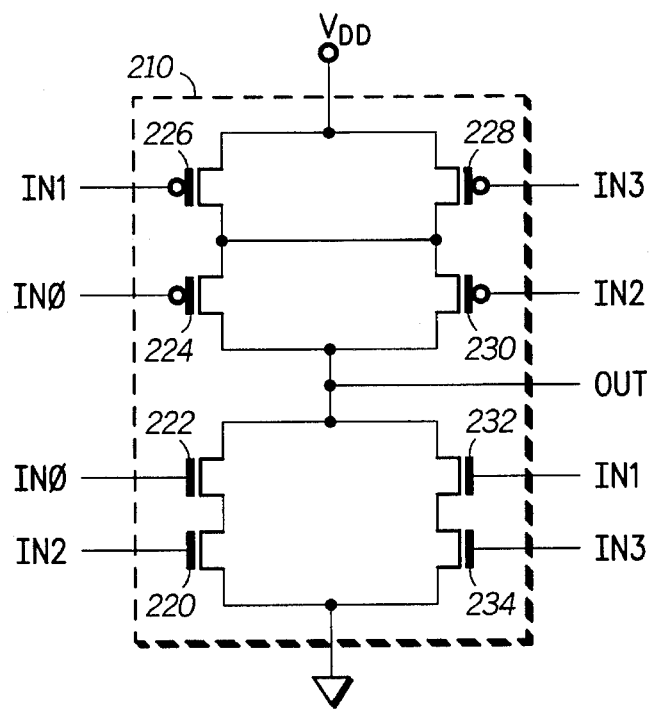
FIG. 13 illustrates, in a block diagram, a circuit diagram describing the custom logic block 210 of FIG. 12 in further detail in accordance with the present invention.

FIG. 13 illustrates the custom logic block 210 which has logic elements, a power supply terminal $V_{dd}$, an output terminal (out), and inputs in0 (coupled to the gates of transistors 224 and 222), in1 (coupled to the gates of transistors 226 and 232), in2 (coupled to the gates of transistors 220 and 230), and in3 (coupled to the gates of transistors 228 and 234) correspond to the inputs in FIG. 12. The circuit of FIG. 13 is a custom logic block because conventional logic gates such as AND, NAND, OR, NOR, inverters, XOR, and the like cannot directly describe the implementation of circuit 13 accurately. Instead, a function F is used to describe the input-to-output relationship of FIG. 13.

Figure 14:
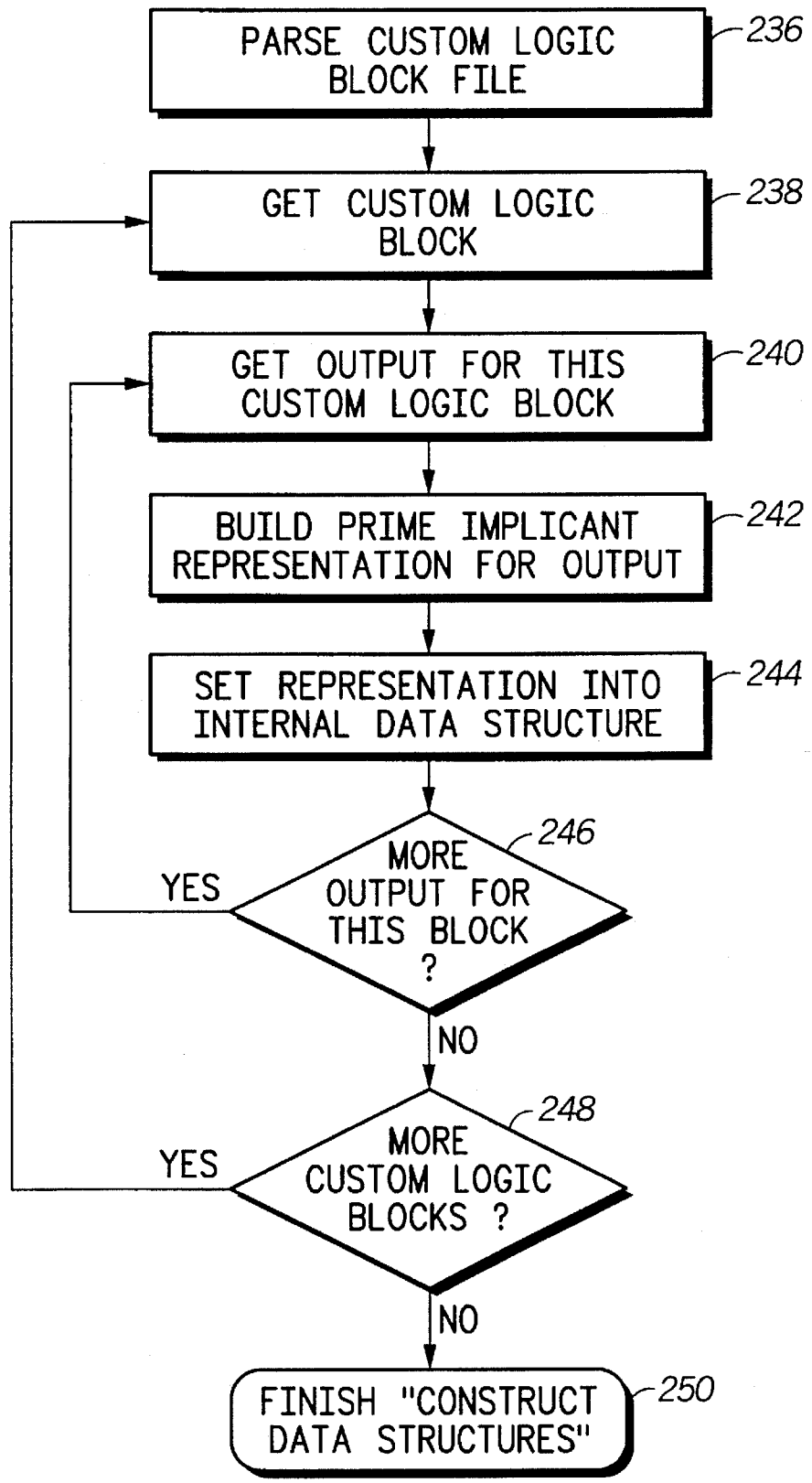
FIG. 14 illustrates, in a flow chart, several specific steps that describe the process in building the internal data structure to describe or represent the control logic block 210 of FIG. 12 in accordance with the present invention.

FIG. 14 illustrates a method for building an internal data structure to represent the custom logic block 210. A step 236 takes, as input, a custom logic block file (stored in memory), which is described in the following manner (the following code example will be termed Code Example A):

/* CODE EXAMPLE A */ module CLB (in0,in1,in2,in3,out);

input in0;

input in1;

input in2;

input in3;

output out;

assign out=(~in0 &~in1) | (~in0 & ~in3) | (~in2 & ~in1)
|
(~in2 & ~in3);

endmodule

In the above Code Example A, the symbol "~" stands for negation. Code Example A is all legal code in the Verilog programming language. As stated above, code Example A is a Verilog program that contains one module that describes the custom logic block 210 in the custom logic block file. It can also be mentioned that Code Example A can be written in any high level language program (such as a C program or PASCAL program). Code Example A can contain a plurality of outputs or one output, and Code Example A can contain a plurality of modules which collectively define a custom logic block file. A step 236 in FIG. 14 opens the custom logic block file for parsing. A step 238 in FIG. 14 parses the custom logic block file for a custom logic block module that contains the Boolean logic which describes the custom logic block 210. A step 240 parses the custom logic block module looking for a Boolean algebra output statement in the custom logic block module and reads the output Boolean logic function "assign out" of code Example A (i.e., function F). A step 242 takes the Boolean logic output function "assign out" and builds the prime implicant representation of that output data. The prime implicant representation of the custom logic block 210 in FIG. 13 is described in the following manner (the following example will be termed Example B):

EXAMPLE B

Function: F=a'b'+a'd'+c'b'+c'd'

Inverse Function: F'=ac+bd

Wherein the function F is analogous to the function "assign out" of Code Example A.

In the above Example B, the symbol '+' stands for the Boolean logic OR and the symbol "'" stands for inverse. Example B represents the custom logic block's output function F and the function's inverse F'. In Example B, the variables a, b, c and d all respectively correspond to the variables in0, in1, in2 and in3 in Example A. Each of the product terms in both functions represents a prime implicant. For example, in Example B the output function F has four prime implicants, which are: a'b', a'd', c'b', and c'd'. Also, in Example B the output function F' has two prime implicants, which are ac and bd. A step 244 of FIG. 14 sets the prime implicant representation into an internal data structure as described in the following manner (the following example will be termed Example C):

EXAMPLE C

|  | F |  | F' |
|---|---|---|---|
| d c b a |  | d c b a |  |
| PT1: 0 . . . 0 0 0 0 | non-inverted inputs | PT1: 0 . . . 0 1 0 1 |  |
| 0 . . . 0 0 1 1 | inverted inputs | 0 . . . 0 0 0 0 |  |
| PT2: 0 . . . 0 0 0 0 |  | PT2: 0 . . . 1 0 1 0 |  |
| 0 . . . 1 0 0 1 |  | 0 . . . 0 0 0 0 |  |
| PT3: 0 . . . 0 0 0 0 |  |  |  |
| 0 . . . 0 1 1 0 |  |  |  |
| PT4: 0 . . . 0 0 0 0 |  |  |  |
| 0 . . . 1 1 0 0 |  |  |  |

In the above Example C each of the prime implicants, PT1 is prime implicant one, PT2 is prime implicant two, PT3 is prime implicant three, and PT4 is prime implicant four, represent a machine word bit array whose input data is read from right to left; the first word representing non-inverted inputs and the second word representing inverted inputs. For example, in Example C, PT1 has a first row of "0 . . . 0 0 0 0" and a second row of "0 . . . 0 0 1 1". The first row is the non-inverted inputs d, c, b, and a and row two represents the inverted inputs d', c', b', and a'. Therefore, in Example C, the PT1 in the non-inverted function has all zeroes for the non-inverted inputs since non-inverted values d, c, b, or a are not present in the first product term (which is logically equal to a'b') of function F in Example B. However, since the first prime implicant in the non-inverted function F of Example B is a'b', the PT1 in the non-inverted function F of Example C sets the value of the a and b bit in row two to a one to indicate that it has been selected.

Step 246 in FIG. 14 checks for more output Boolean logic statements in the custom logic block module and if another output Boolean logic statement is found, then the step 240 is performed, else a step 248 is performed which checks for more custom logic block modules. If the step 248 finds another custom logic block module, then step the 238 is performed, else a step 250 is performed which indicates that the prime implicant data structure is constructed.

Figure 15:
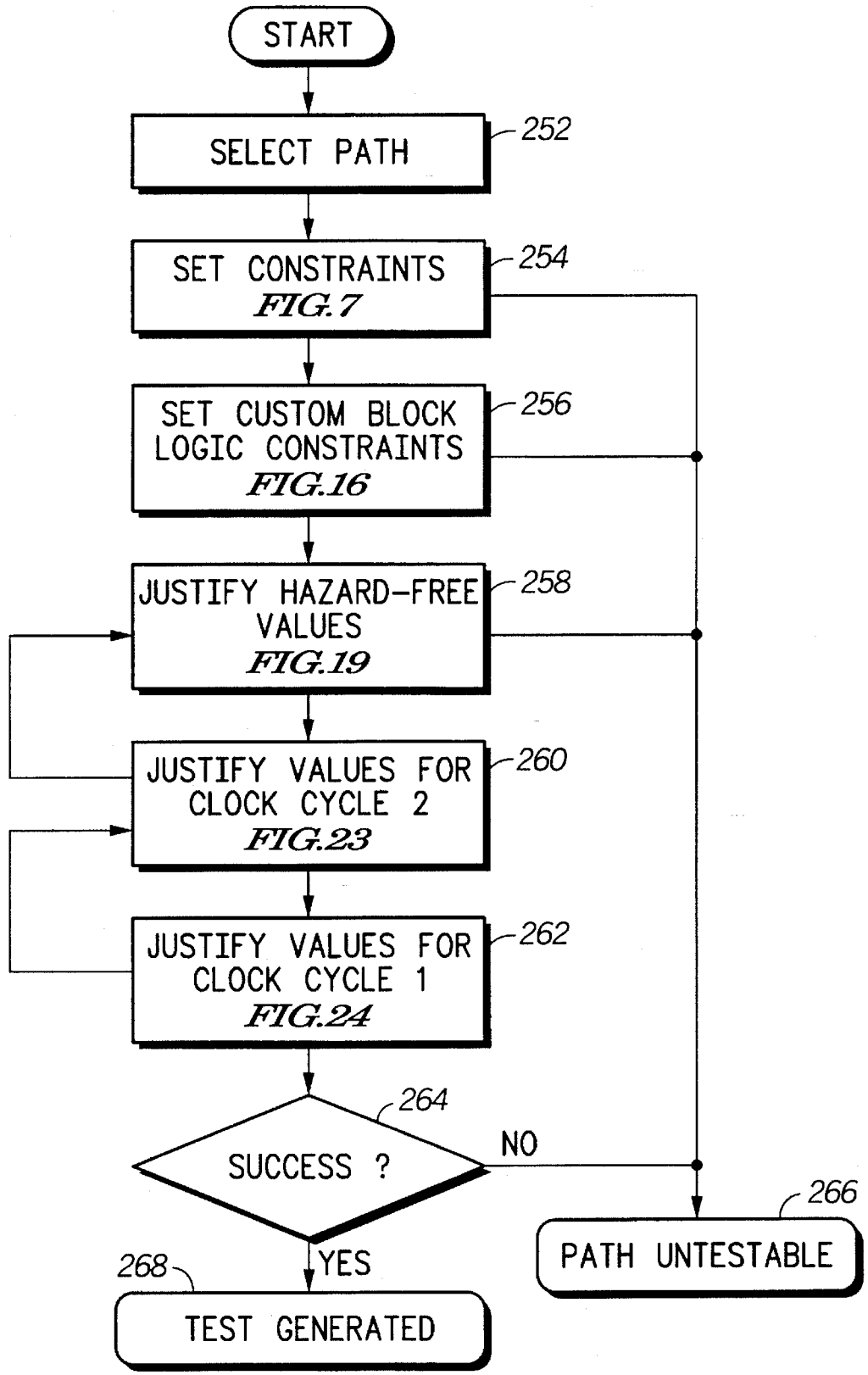
FIG. 15 illustrates, in a flowchart, a method for generating a test vector which is used to test a delay path in an electrical circuit in accordance with the present invention.

Once FIG. 14 is executed and the prime implicant data structure is formed, then FIG. 15 illustrates a flowchart which describes how a robust speed path test vector is generated for any circuit that may have a custom logic block or several custom logic blocks. In a step 252, a path is selected from a list of paths (stored in memory) for which path-delay tests are to be generated. In a step 254, the standard logic device's logic value constraints for the path-delay test are determined from the description of the path and the circuit model (see FIG. 7). If a path is found to be untestable in the step 254, then the path is declared untestable in a step 266. In a step 256, the custom logic block's logic value constraints for the path-delay test are determined from the description of the path, the circuit model, and the data structure for the custom logic block (see FIG. 16). If a path is found to be untestable in the step 256, then the path is declared untestable in the step 266. These logic value constraints are then justified, in a particular order depending on the type of constraint that is required.

In a step 258, the first logic value constraints to be justified are the hazard-free values that are required to be free of timing hazards. If a path is found to be untestable in the step 258, then the path is declared untestable in the step 266. Next, the logic value constraints for the second clock cycle are justified in a step 260. Finally, the logic value constraints for the first clock cycle are justified in a step 262. In a step 264, the test generation result is checked to see if values have been successfully determined to justify all the required logic value constraints, and if they have been successfully generated, then a test vector is declared to have been generated and is saved as an output result vector in a step 268. If all possible values are tried (implicitly) and it proves impossible to justify all the required logic value constraints, then the selected path is declared to be untestable in a step 266. Only two clock cycles are required for this test because the integrated circuit is required to have scannable flip-flops as memory elements. This means that the first set of values required for the test vector can be serially shifted into the memory elements rather than having to be produced by the functionality of the integrated circuit.

Figure 16:
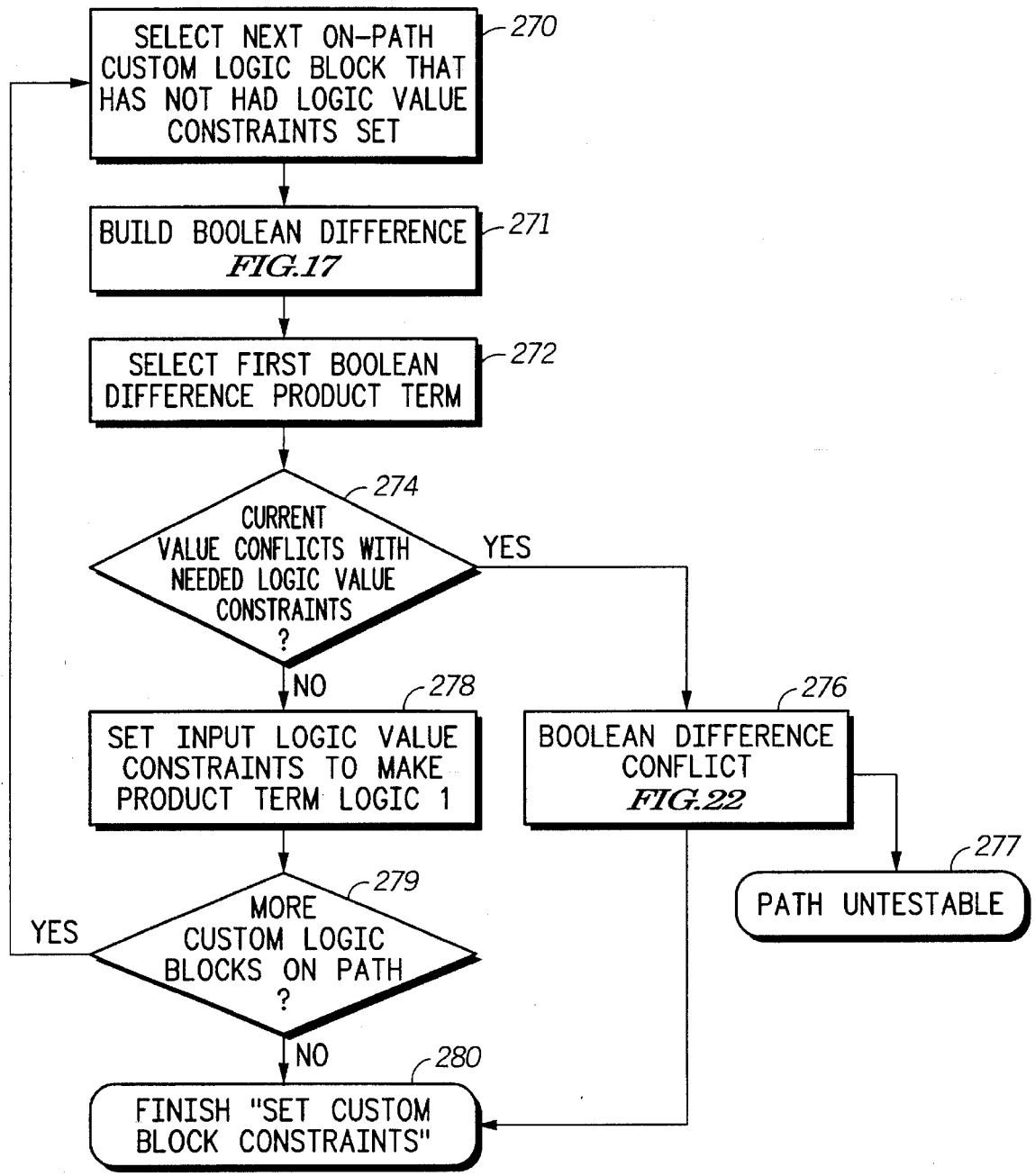
FIG. 16 illustrates, in a flowchart, several specific steps involved when setting logic constraints for custom logic blocks as illustrated in FIG. 15 in accordance with the present invention.

FIG. 16 illustrates the flowchart for the step 256 of FIG. 15. First, the next custom logic block on the circuit path that has not had logic values constraints set is selected in a step 270. A step 271 builds the Boolean difference data structure (discussed above), which is the result of all the product terms involving the specified input in the non-inverted function F being paired with all product terms involving the specified input in the inverted function F'. The Boolean difference building process is illustrated in more detail in FIG. 17. A step 272 selects the first Boolean difference product term. A step 274 checks if the current logic value constraints, set on the Boolean difference product term, conflicts with the needed logic value constraints. If there is a conflict with the current logic value constraints with the needed logic value constraints in the step 274, then flow continues to a step 276; else flow continues to a step 278. The step 276 calls the Boolean Difference Conflict procedure to try to find an unused Boolean difference product term and assign input logic value constraints in order to resolve the conflict, which is described in more detail in FIG. 22. If the path is found to be untestable in the step 276, then the path is declared untestable in a step 277; else the Set Custom Block Constraints procedure is exited in a step 280.

The step 278 sets input logic value constraints on the inputs to the custom logic block to make the product term logic one. For example, if logic values a and c were selected as the first product term (first product term=ac) in the Boolean difference set, then both a and c would have to be a logic value of one in order to make the product term ac a logic one as described in the following manner (the following example will be termed Example D):

EXAMPLE D a·c=1 a=1 c=1

The custom logic block in the step 278 is added to a list of constrained custom logic blocks that have had constraints placed on their inputs, and a step 279 checks for more custom logic blocks on the path; if there are more custom logic blocks on the path, then go back to the step 270; if there are no more custom logic blocks on the path, then the flow continues to the step 280, which exits the Set Custom Block Constraints procedure.

Figures 17, 18:
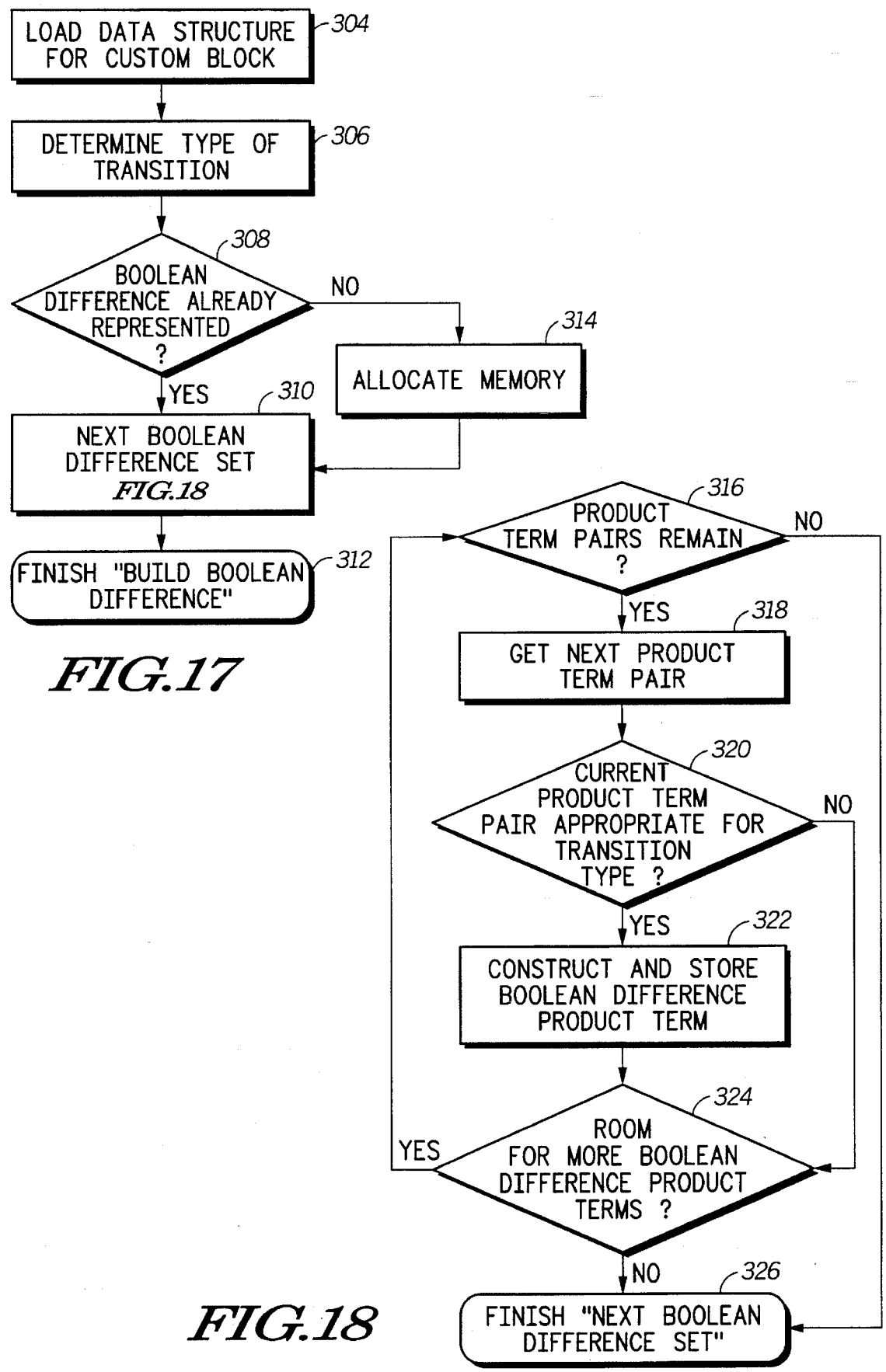
FIG. 17 illustrates, in a flowchart, several specific steps that describe building another part of the data structure that represents a custom logic block that is directly in the delay path in accordance with the present invention.
FIG. 18 illustrates, in a flowchart, several specific steps that describe the process for finding the next Boolean difference set in accordance with the present invention.

FIG. 17 illustrates a method for building another data structure from the data structure derived from FIG. 14. The data structure formed by FIG. 17 represents a custom logic block that lies on the selected circuit path. For example, in FIG. 12 a selected circuit path could comprise a first input B, which has an output coupled to a custom logic block 210, wherein the custom logic block 210 has an output coupled to a NOR gate 206, wherein the NOR gate 206 has output coupled to an inverter 208 gate, wherein the inverter gate 208 has an output coupled to an output terminal, represent a delay path that is directly affected by the custom logic block 210. A step 304 loads the prime implicant data structure as described above (see FIG. 14) and a step 306 determines which of the four types of custom logic block transitions as described in the following manner (the following example will be termed Example E):

EXAMPLE E

| Four Types of Transitions: | |
|---|---|
| 1. Input Rising | Output Rising |
| 2. Input Rising | Output Falling |
| 3. Input Falling | Output Falling |
| 4. Input Falling | Output Rising |

A step 310 in FIG. 17 checks if a Boolean difference is already represented in the data structure, wherein a Boolean difference is a product term from F paired with a product term from F'. The Boolean differences are used to determine which values are to be hazard free as described in the following manner (the following example will be termed Example F):

EXAMPLE F

Function: F=a'b' + a'd' + c'b' + c'd'
Inverse Function: F'=ac+bd
Boolean Difference Set                Steady-Values Marks
                                      Hazard Free
         d c b a                              d c b a

| | | | |
|---|---|---|---|
| PT1: | 0 ... 0 1 0 0 | non inverted inputs | SPT1: 0 ... 0 0 1 0 |
| | 0 ... 0 0 1 0 | inverted inputs | |
| PT2: | 0 ... 0 1 0 0 | non inverted inputs | SPT2: 0 ... 1 0 0 0 |
| | 0 ... 1 0 0 0 | inverted inputs | |

Example F is an example of the step 306 resulting in a transition of input "a" rising and output F falling (F→F'), which is transition number two in Example E. In Example F, the non-inverted function F first product term (which is logically a 'b') is paired with the inverted function F' first product term (which is logically ac), and all on-path inputs (a, and a', these are directly on the path being tested) in this pairing are removed from these product terms resulting in modified product terms (b' and c). These modified product terms are logically ANDed, which will result in the product term b'c, which is depicted in Example F via product term PT1. Also, in Example F, the non-inverted function F second product term a'd' is paired (by modifying and ANDing as taught above) with the inverted function F' first product term ac, which will result in the product term d'c, which is depicted in Example F via product term PT2. The two product terms PT1 and PT2 are the only product terms that satisfy the input "a" rising and output F falling transition. All other modifying and ANDing of product terms results in another transition which is not the desired test transition of input "a" rising and output F falling.

A step 314 allocates memory to store the Boolean difference product terms. Therefore, only Boolean differences which result in the proper output transition (i.e., the input "a" rising and output F falling transition) are stored selectively, thereby reducing the memory required for this algorithm (unlike the prior art). It can also be mentioned that a fixed amount of memory can be assigned for the Boolean difference set. Once this Boolean difference set is completely allocated to Boolean differences via FIGS. 17 and 18, no more Boolean differences are calculated in FIGS. 17–18. At a later time (during justification), these Boolean differences in the set may create a conflict and require the generation of more Boolean differences via FIGS. 17–18.

In Example F, there are only two appropriate product terms in the Boolean difference set; however, any finite non-zero number of Boolean differences up to a maximum defined memory limit may be stored as a Boolean difference set, as long as the memory allocated does not exceed the physical memory of the machine as described in FIG. 2, memory 52. This maximum defined memory limit is set in software. For example, if the maximum possible stored product terms in the Boolean difference set were two, and the total number of Boolean difference product terms available were five, then a first Boolean difference set would have two terms, a second Boolean difference set would have two terms, and a third Boolean difference set would have only one term. Each of the three Boolean difference sets being derived by FIGS. 17–18. In other words, the algorithm of FIGS. 17–18 would have to be executed three times in order to exhaustively find all appropriate Boolean differences for the custom logic block. A step 310 finds the next Boolean difference set, which is described in more detail in FIG. 18. A step 312 indicates that the Boolean difference structure is built.

FIG. 18 illustrates a flow chart that describes the process for finding the next Boolean difference set after executing steps in FIG. 17. A step 316 checks for remaining product terms in the prime implicant data structure. If no more product terms remain, a step 326 indicates that the last Boolean difference set was found. A step 318 gets the next product term pair and a step 324 determines if the current product term pair is appropriate for the transition type defined in the step 314 of FIG. 17. A step 322 constructs and stores the Boolean difference product term in a machine word bit array (as illustrated in Example F—Boolean Difference Set) if the Boolean difference term is appropriate. Example F also illustrates that the machine word bit array stores the hazard free values used to generate a test vector (these hazard free values and their generation are discussed in subsequent justification flowcharts). For example, in Example F both of the logic values b and d are found in subsequent flowcharts to have a steady or hazard free value of zero (meaning b' and d' are hazard free ones) during the "a" rising and F falling transition and variable "c" can either be a zero or one (i.e. a don't care) for the first test clock cycle; and the variable "c" has the value of one for the second clock cycle, as described in the following manner (the following example will be termed Example G):

EXAMPLE G (1) b=S0, c=X1

(2) d=S0, c=X1

In Example G, the variable "c" is a don't care in the first clock cycle since the terms a'b' and a'd' in Example F render the logical function F a logical 1 regardless of the value of "c", either 0 or 1. However, for the second clock cycle the variable "c" is a variable in the output transition and must have a logical value of one. For example, the product term PT1 in Example F is b'c' and since the variable "b" is a steady zero, the variable "c" must have a logic value of one to render the output a logical 1. Furthermore, since the transition in Example F is Input Rising and Output Falling (F→F'), the value of F is zero for the final clock cycle and F'=1 when F=0, therefore, the product term b'c must equal a logical value of one.

In Example F, the product term SPT1, which is a machine word bit array data structure, sets the value of the variable b' bit to a one to indicate that variable b is a steady or hazard free zero value (see right-hand side of Example F). The product term SPT2, which is a machine bit array data structure, sets the value of the d' bit to a one to indicate d is also a steady or hazard free zero value (see right-hand side of Example F). A step 324 checks if the memory allocated to store the Boolean difference in the step 314 FIG. 17 is full. If memory is not full, then go to the step 326. If memory is full, then go to the step 316.

Figure 19:
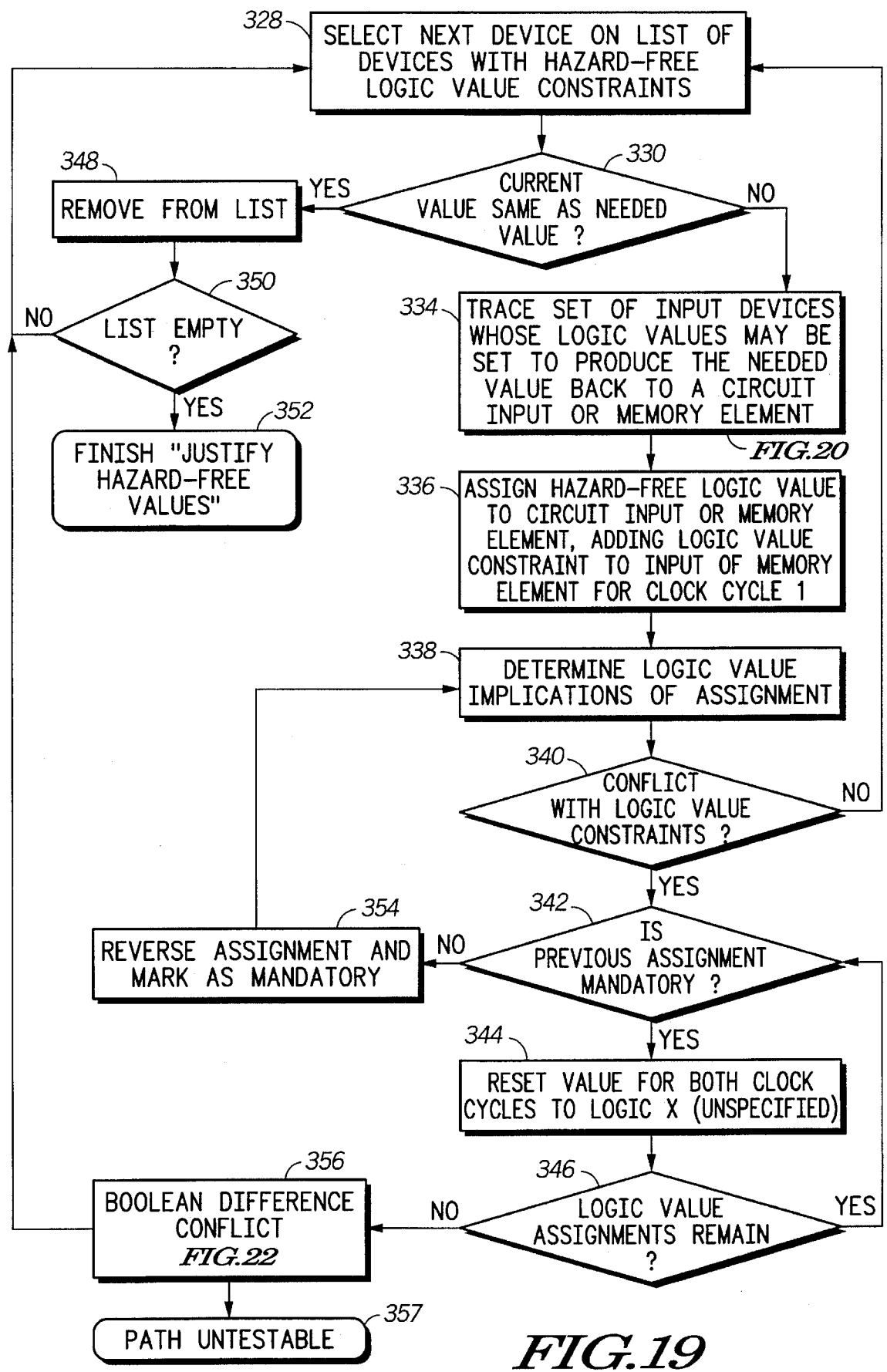
FIG. 19 illustrates, in a flowchart, several specific steps which are involved when justifying hazard-free logic values for standard logic devices and/or custom logic blocks as illustrated in FIG. 15 in accordance with the present invention.

FIG. 19 illustrates the flowchart for the step 258 in FIG. 15. In a step 328 the next circuit device on a list of devices with hazard-free logic value constraints is selected. The selected circuit device is examined to see if its current logic value is the same as the logic value required by the logic value constraint in a step 330. If the current logic value is not the same as the logic value required by the logic value constraint, then in a step 334 a process of backtracing from the input devices of the selected circuit device is initiated. The backtracing process in the step 334 is illustrated in more detail in FIG. 20. The hazard-free logic value that is needed to assist in producing the hazard-free logic value on the initially selected circuit device is assigned to the circuit input terminal or scannable flip-flop in a step 336. A step 338 performs a logic simulation to determine the logic value implications of the logic value assignment made in the step 336.

Circuit devices that are simulated are checked for conflict with their logic value constraints in a step 340. If no conflict is determined in the step 340, the flow returns to the step 328. If there is conflict between the current logic value and the logic value constraint for some circuit element in the step 340, then a step 342 examines the previous logic value assignment to see if it is a mandatory assignment, i.e., an assignment that is either required to have its present value by some logic value constraint in the circuit model, or has already had the inverse hazard-free value simulated and found to cause conflict. If the previous assignment is not mandatory, then in a step 354 its hazard-free logic value assignment is inverted and marked as mandatory and flow returns to the step 338. If the previous assignment is mandatory, then in a step 344 the circuit input terminal or scannable flip-flop to which the assignment had been made is returned to an unspecified state (logic value X) and the record of the previous logic value assignment is removed from the list of such records.

A step 346 examines the list of records of logic value assignments to see if more records remain on the list. If there are more records on the list of records of logic value assignments, flow returns to the step 342. If there are no more records of logic value assignments on the list, then all possible logic value assignments have been tried and found to produce conflict with required logic value constraints; however, if a custom logic block is in the path, then a step 356 calls the Boolean Difference Conflict procedure to try to find an unused Boolean difference product term and assign input logic value constraints in order to resolve the conflict, which is described in more detail in FIG. 22. If a path is found to be untestable in the step 356, then the path is declared untestable in a step 357. If the examination in the step 328 reveals that the current logic value is the same as the logic value required by the logic value constraint, then the selected logic device is simply removed from the list of devices with hazard-free logic value constraints in a step 348. A step 350 examines the list of circuit devices with hazard-free logic value constraints to see if the list is empty. If the step 350 reveals that the list of circuit devices with hazard-free logic value constraints is not empty, then flow returns to the step 328. If the step 350 reveals that the list is empty, then the Justify Hazard-free Values procedure is exited in a step 352.

Figure 20:
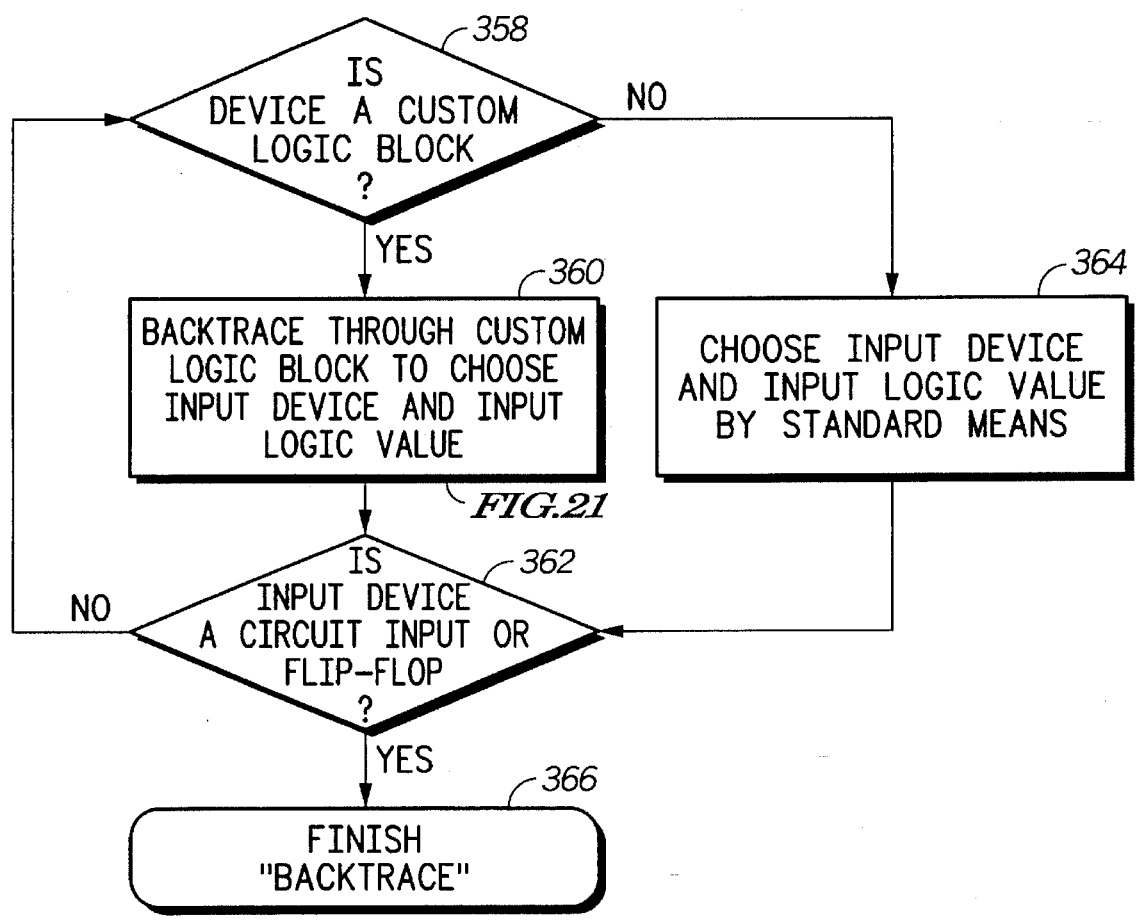
FIG. 20 illustrates, in a flowchart, several specific steps which are involved when backtracing input devices whose logic values may be set to produce the needed value back to a circuit input or memory element in accordance with the present invention.

FIG. 20 illustrates the flowchart for backtracing input devices from the step 332 in FIG. 19. A step 358 determines if the input logic device is a custom logic block. If the device is a custom logic block, then a step 360 will backtrace through a custom logic block to choose input device and input logic value, which is described in more detail in FIG. 21. If an input device is found to be a standard logic element, then a step 364 will choose the input device and input logic value by a standard means. This standard means of backtracing consists of selecting an input device whose current logic value (and logic value constraint, if any such exists for this input device) is compatible with the input logic value needed to produce the hazard-free logic value specified by the logic value constraint on the selected logic device. A step 362 examines if the input device is a circuit input or flip-flop. If the input device is not a circuit input or flip-flop, then the step 358 is called to check if the input device is a custom logic block. If the input device in the step 362 is a flip-flop or a circuit input, then the Backtrace procedure is exited in a step 366.

Figure 21:
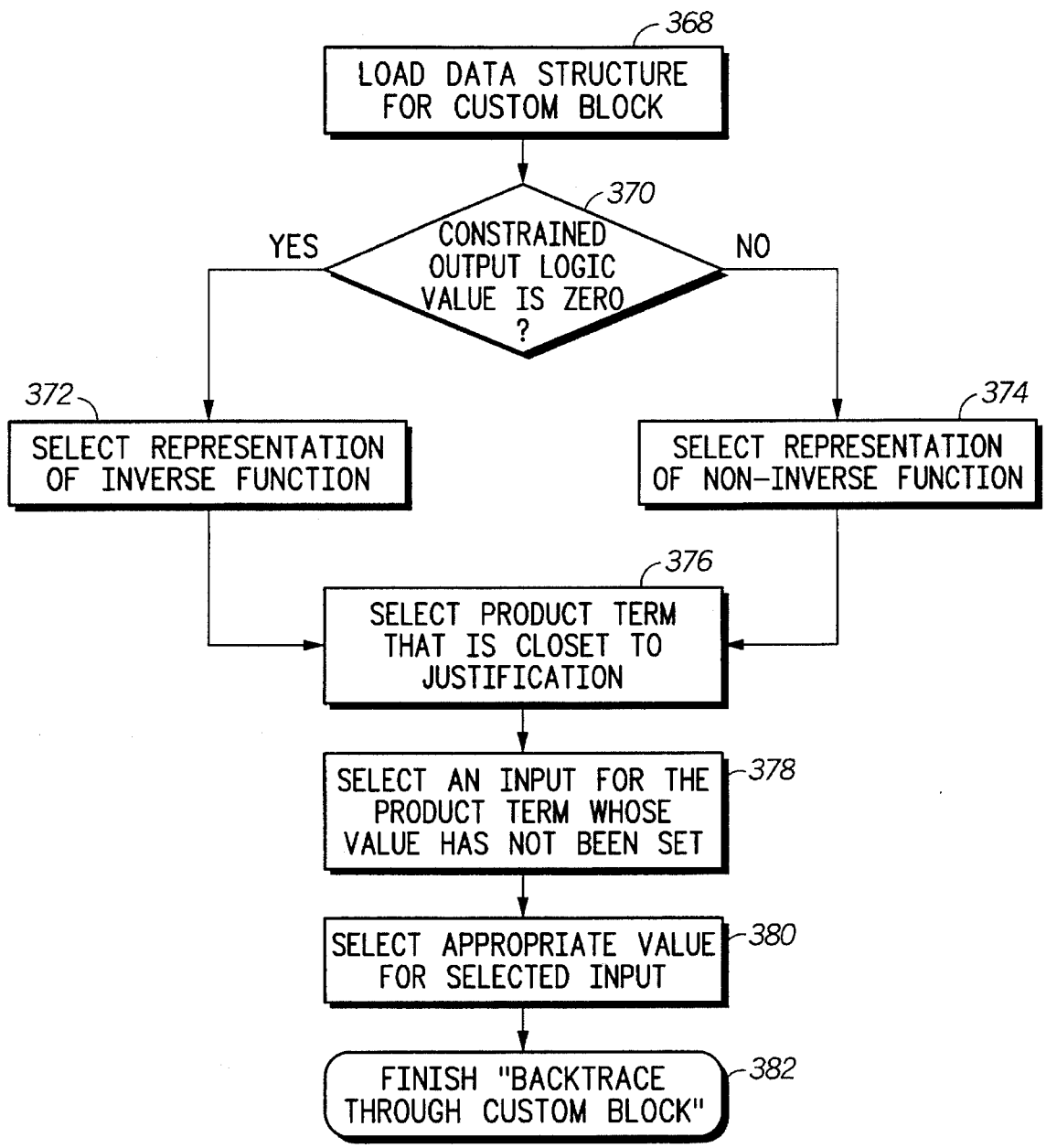
FIG. 21 illustrates, in a flowchart, several specific steps which are involved when tracing a custom logic block whose logic values may be set to produce the needed value back to a circuit input or memory element in accordance with the present invention.

FIG. 21 illustrates the procedure for backtracing through a custom logic block in the logic circuit path from the step 360 in FIG. 20. A step 368 loads the prime implicant data structure, as defined above, and a step 370 determines what is the constrained output logic value, which is either a zero or one. If the constrained logic output value is zero, then a step 372 selects the representation of the inverse function F'; else a step 374 selects the representation of the non-inverse function F. A step 376 selects the product term that is nearest justification, which means that the product term that is closests to already being set to one is selected. For example, if the inverse function is selected in the step 372, and the first product term for the inverse function is ac, whereas c has the logic value of one and a has a value that has not been set; a second product term for the inverse function is abc, whereas c has the value of one and both a and b values have not been set; since the first term can easily be set by assigning variable "a" a value of one, the product term that would be nearest justification is product term ac. A step 378 selects an input for the product term whose value has not been set; for example, if the product term is ab and the input value of b has not been set, then the input value b is selected. These selections may subsequently create a conflict and may need to be reversed and other products terms selected as taught herein. A step 380 selects the appropriate value for selected input; for example, if the product term is ab and the input value of a is one and the input value of b has not been selected, then in order to make the product term, ab, a logic one, the input value of b is assigned a logical value of one; however, if b was inverted, b', then the input value of b is assigned a logical value of zero. The Backtrace Through Custom Block procedure is exited in a step 382.

Figure 22:
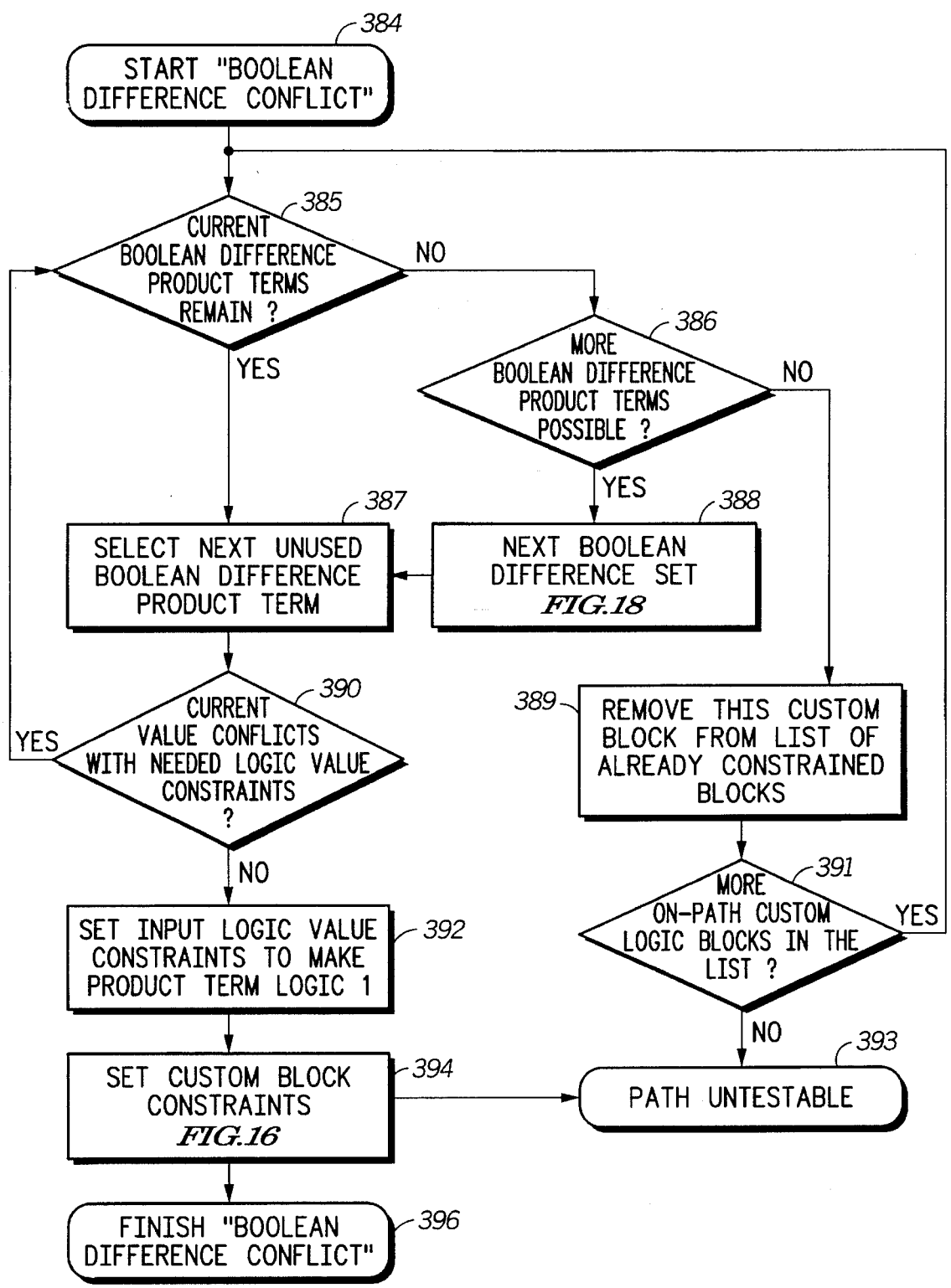
FIG. 22 illustrates, in a flowchart, several specific steps that describe how to handle a Boolean difference conflict in accordance with the present invention.

FIG. 22 illustrates the flowchart that describes how to handle a Boolean difference conflict of the step 356 in FIG. 19. A step 384 begins the Boolean Difference Conflict procedure. A step 385 checks if there are any product terms remaining in Boolean difference set, and if there are product terms remaining, then flow continues to a step 387; if no product terms are remaining, then flow continues to a step

386. A step 386 checks if there are more possible Boolean difference product terms, and if there are more possible product terms, flow continues to a step 388, which will get the next Boolean difference set, which is found via FIG. 18. If there are no more Boolean difference product terms possible in the step 386, then a step 389 removes the custom block selected on the path from the list of already constrained custom logic blocks defined in the step 278 of FIG. 16.

A step 391 checks for more custom logic blocks in the list of constrained custom logic blocks; if there are more custom logic blocks in the list of constrained custom logic blocks, then go back to the step 384; if there are no more custom logic blocks in the list of constrained custom logic blocks, then the flow continues to a step 393, which indicates that the path is untestable. A step 390 checks if the current logic value constraints, set on the Boolean difference product term, conflicts with the needed logic value constraints. If there is a conflict with the current logic value constraints with the needed logic value constraints in the step 390, then flow continues back to the step 385; else flow continues to a step 392. A step 392 sets the input logic value constraints to make the product term logic one, in order to justify the input values, which will sensitize the path. A step 394 calls the Set Custom Block Constraints procedure in order to add and set constraints on the custom logic blocks that were removed in the step 389, which is described in more detail in FIG. 16. If the path is found to be untestable in the step 394, then the path is declared untestable in the step 393; else the Boolean Difference Conflict procedure is exited in a step 396.

Figure 23:
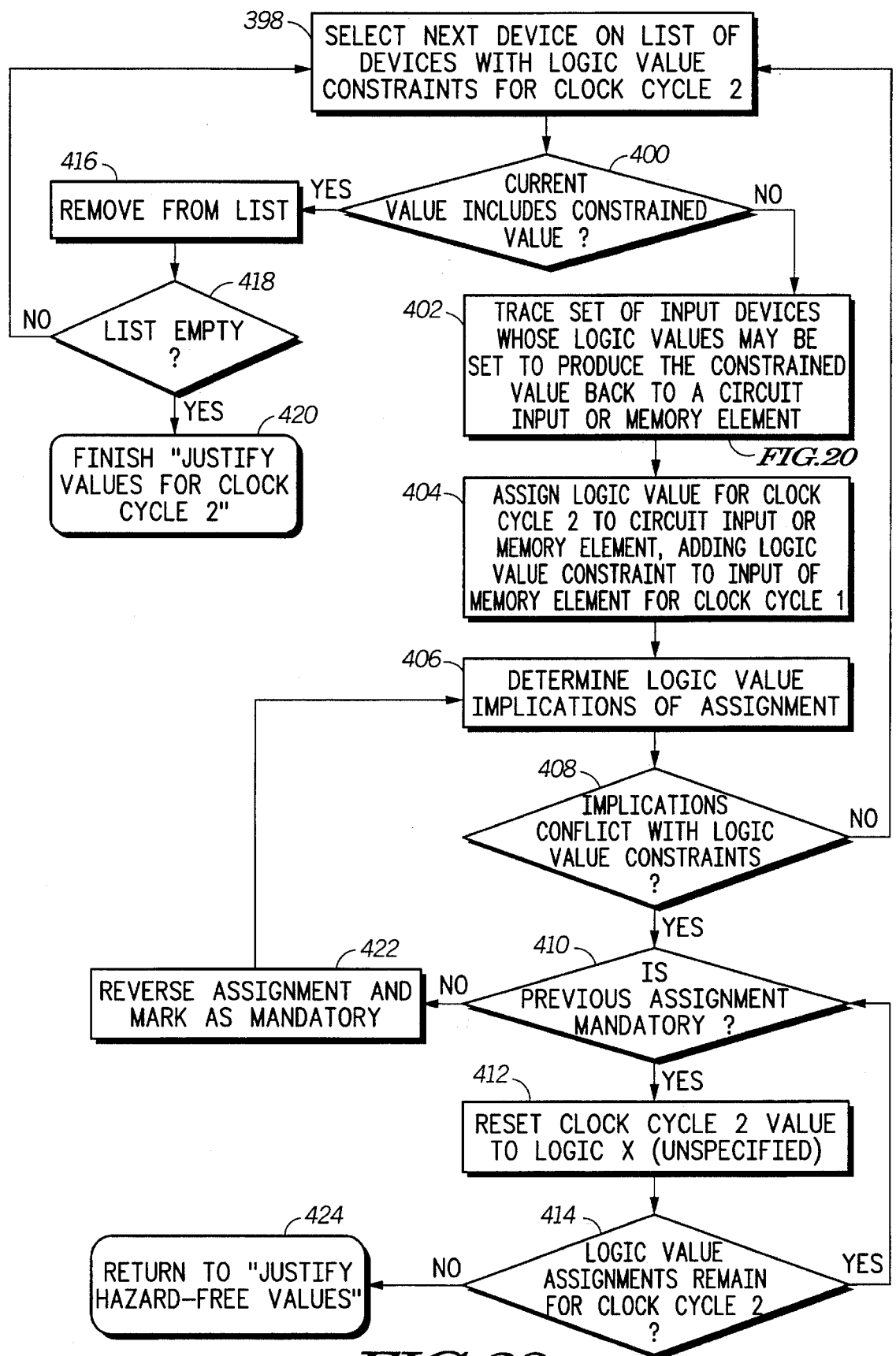
FIG. 23 illustrates, in a flowchart, several specific steps which are involved when justifying values for a second clock cycle as illustrated in FIG. 15 in accordance with the present invention.

FIG. 23 illustrates the flowchart for the step 260 in FIG. 15. A step 398 selects the next circuit device on the list of devices with logic value constraints for the second clock cycle. A step 400 examines the selected circuit device to see if its current logic value includes the logic value required by the logic value constraint. A first logic value is said to include a second logic value if all the requirements for the second logic value are also met by the first logic value. If the current logic value does not include the logic value required by the logic value constraint, then a step 402 initiates a process of backtracing from the input devices of the selected circuit device is initiated. The backtracing process in the step 402 is illustrated in more detail in FIG. 20. The logic value that is needed to assist in producing the value required by the logic value constraint for the second clock cycle on the initially selected circuit device is assigned to the circuit input terminal or scannable flip-flop in a step 404. A step 406 performs a logic simulation to determine the logic value implications of the logic value assignment made in the step 404.

Circuit devices that are simulated are checked for conflict with their logic value constraints in a step 408. If no conflict is determined in the step 408, the flow returns to the step 398. If there is conflict between the current logic value and the logic value constraint for some circuit element in the step 408, a step 410 examines the previous logic value assignment to see if it is a mandatory assignment, i.e., an assignment that is either required to have its present value by some logic value constraint in the circuit model or has already had the inverse value for the second clock cycle simulated and found to cause conflict. If the previous assignment is not mandatory, then its logic value assignment is inverted and marked as mandatory in a step 422 and flow returns to the step 406. If the previous assignment is mandatory in the step 410, then a step 412 returns the circuit input terminal or scannable flip-flop to which the previous logic value assignment had been made to an unspecified state (logic value X) for the second clock cycle and the record of the previous logic value assignment is removed from the list of such records.

A step 414 examines the list of records of logic value assignments to see if more records remain on the list. If there are more records on the list, flow returns to the step 410. If there are no more records of logic value assignments on the list, then all possible logic value assignments for the second clock cycle have been tried and found to produce conflict with required logic value constraints, so some of the hazard-free assignments made in the step 258 of FIG. 15 have made it impossible to complete the generation of the test vector, so a step 424 returns to the step 258 of FIG. 15 to attempt to find a different assignment of hazard-free values that will allow the successful generation of a test vector. If the step 400 reveals that the current logic value does include the logic value required by the logic value constraint, a step 416 removes the selected logic device from the list of devices with logic value constraints for the second clock cycle.

A step 418 examines the list of circuit devices with logic value constraints for the second clock cycle to see if the list is empty. If the step 418 reveals that the list of circuit devices with logic value constraints for the second clock cycle is not empty, then flow returns to the step 398. If the step 418 reveals that the list of circuit devices with logic value constraints for the second clock cycle is empty, then the Justify Values For Clock Cycle 2 procedure is exited in a step 420.

Figure 24:
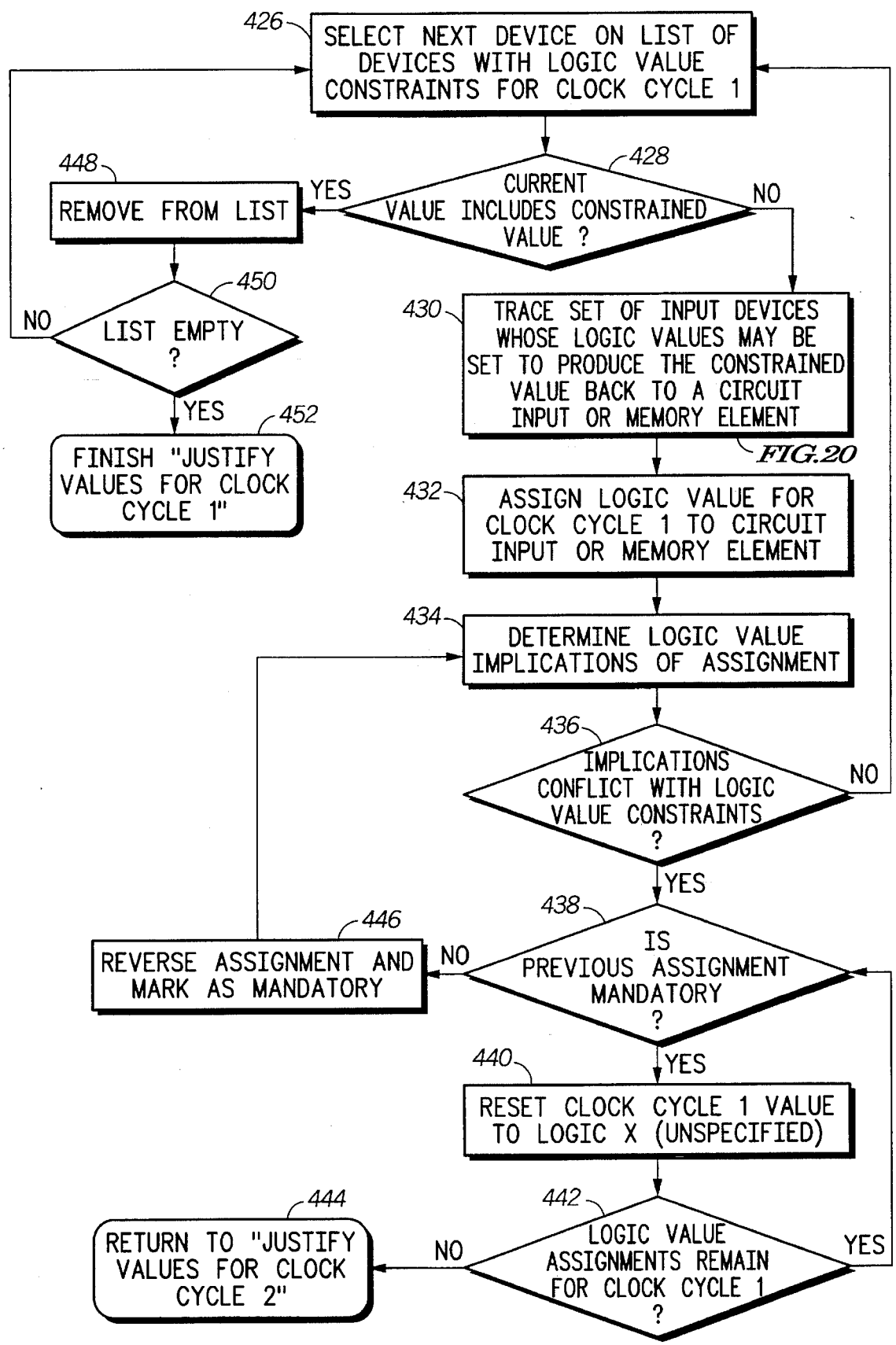
FIG. 24 illustrates, in a flowchart, several specific steps which are involved when justifying values for a first clock cycle as illustrated in FIG. 15 in accordance with the present invention.

FIG. 24 illustrates the flowchart for the step 262 in FIG. 15. A step 426 selects the next circuit device on the list of devices with logic value constraints for the first clock cycle. A step 428 examines the selected circuit device to see if its current logic value includes the logic value required by the logic value constraint. If the current logic value does not include the logic value required by the logic value constraint, then a step 430 initiates a process of backtracing from the input devices of the selected circuit device is initiated. The backtracing process in the step 430 is illustrated in more detail in FIG. 20. The logic value that is needed to assist in producing the logic value required by the logic value constraint for the first clock cycle on the initially selected circuit device is assigned to the circuit input terminal or scannable flip-flop in a step 432. A step 434 performs a logic simulation to determine the logic value implications of the logic value assignment made in the step 432.

Circuit devices that are simulated are checked for conflict with their logic value constraints in a step 436. If no conflict is determined in the step 436, the flow returns to the step 426. If there is conflict between the current logic value and the logic value constraint for some circuit element in the step 436, a step 438 examines the previous logic value assignment to see if it is a mandatory assignment, i.e., an assignment that is either required to have its present value by some logic value constraint in the circuit model or has already had the inverse logic value for the first clock cycle simulated and found to cause conflict. If the previous assignment is not mandatory, then its logic value assignment for the first clock cycle is inverted and marked as mandatory in a step 446 and flow returns to the step 434. If the previous assignment is mandatory, then the circuit input terminal or scannable flip-flop to which the previous assignment had been made is returned to an unspecified state (logic value X) for the first clock cycle and the record of the previous logic value assignment is removed from the list of such records in a step 440.

A step 442 examines the list of records of logic value assignments to see if more records remain on the list. If there are more records on the list, flow returns to the step 438. If there are no more records of logic value assignments on the list, then all possible logic value assignments for the first clock cycle have been tried and found to produce conflict with requires logic value constraints, so some of the assignments for the second clock cycle made in the step 260 of FIG. 15 have made it impossible to complete the generation of the test vector and a step 444 returns to the step 260 of FIG. 15 to attempt to find a different assignment of values for the second clock cycle that will allow the successful generation of a test vector. If the examination in the step 428 reveals that the current logic value does include the logic value required by the logic value constraint, a step 448 removes the selected logic device from the list of devices with logic value constraints for the first clock cycle. A step 450 examines the list of circuit devices with logic value constraints for the first clock cycle to see if the list is empty. If the step 450 reveals that the list of circuit devices with logic value constraints for the first clock cycle is not empty, then flow returns to the step 426. If the step 450 reveals that the list of circuit devices with logic value constraints for the first clock cycle is empty, then the Justify Values For Clock Cycle 1 procedure is exited in a step 452.

The software illustrated herein (such as the elements 160, 162, and 164 in FIG. 11) is stored on one of either a magnetic media (a disk, a compact disk (CD), a tape, a drum, a ferromagnetic device), electrical storage such as random access memory (RAM), static random access memory (SRAM), fast static random access memory (FSRAM), dynamic random access memory (DRAM), flash devices, read only memory (ROM), electrically programmable read only memory (EPROM), electrically erasable read only memory (EEPROM), ferroelectric memory, or like memory media for binary data, source code, object code, or like computer data. The instructions in a computer program may be viewed as English-type instruction on paper or binary/ASCII values stored in either memory cells or magnetic media.

While the present invention has been shown and described with reference to specific embodiments, further modifications and improvements will occur to those skilled in the art. For example, the transfer of the generated test vectors to the test controller 166 in FIG. 11 could be done by other means, such as tape or floppy disk, rather than by a bus. There are several steps in the method for generation of test vectors that could be done slightly differently. The use of a many-valued logic algebra could be avoided by keeping a record of which choices had already been tried at each node in the circuit at which a decision had to be made, for example at a three-input AND gate whose output is to be set to a hazard-free logic zero. The logic algebra actually employed in this invention is only a subset of a more complete algebra in which each possible logic value for the first clock cycle (0,1,X,Y) is combined with each possible value for the second clock cycle (0,1,X,Y) and the possible hazard-free status (hazard-free, not yet hazard-free but may be made to be so, cannot be made hazard-free). This combination would provide 48 logic values, which would be substantially more unwieldy than the logic algebra used in this invention.

While the justification hazard-free logic values (the step 36 of FIG. 6) must be done prior to the justification of either values for clock cycle 2 (the step 38 of FIG. 6) or values for clock cycle 1 (the step 40 of FIG. 6), it was chosen to justify values for the second clock cycle (the step 38) prior to justifying values for the first clock cycle (the step 40) for reasons of efficiency rather than of necessity. One could even mix the justification of values for clock cycle 1 and clock cycle 2, with no fixed order, without completely invalidating the method. Finally, there are some standard improvements to test generation approaches for stuck-at faults that could be applied equally well to the present invention. For example, static or dynamic learning procedures, the use of statically or dynamically computed testability measures as heuristics to guide internal choices, and the saving of values that have previously produced certain internal circuit states could all be applied to this invention. It is to be understood, therefore, that this invention is not limited to the particular forms illustrated and that it is intended in the appended claims to cover all modifications that do not depart from the spirit and scope of this invention.

What is claimed is:

1. A method for generating test vectors for use when testing an electrical circuit, the method comprising the steps of:

(a) providing a database which identifies a circuit model wherein the circuit model models the electrical circuit, the circuit model identifying a plurality of circuit paths;

(b) selecting one path from the plurality of circuit paths, the one path being referred to as a selected path, the selected path being affected by at least one custom logic block;

(c) identifying a Boolean function within the circuit model which defines a logical operation of the custom logic block;

(d) storing a product term binary data structure in memory to represent both the Boolean function and an inverse Boolean function of the Boolean function;

(e) assigning a fixed amount of memory for storing Boolean differences in a Boolean difference set, the Boolean differences being calculated via the product term binary data structure;

(f) creating the Boolean difference set, via the product term binary data, until either the fixed amount of memory is fully used or no more Boolean differences can be generated;

(g) determining logic value constraints for the selected path by accessing the Boolean difference set;

(h) justifying the logic value constraints to determine if any conflicts result with the Boolean difference set;

(i) repeating steps (f) through (h) if a conflict results with the Boolean difference set until either no conflict results in step (h) or the path is determined to be untestable due to conflicts; and (j) generating a test vector from the logic value constraints determined in step (g).

2. The method of claim 1 wherein the test vector is used to test the electrical circuit by applying the test vector to the electrical circuit and subsequently applying a first clock cycle and a second clock cycle to the electrical circuit.

3. The method of claim 1 wherein the step (h) comprises:

justifying hazard free values;

justifying values for a first test clock cycle needed to test the electrical circuit; and justifying values for a second test clock cycle needed to test the electrical circuit.

4. The method of claim 3 wherein the step of justifying hazard free values is the only step of justifying which can result in conflicts with the Boolean difference set.

5. The method of claim 1 wherein the selected path is determined to be untestable for a given input-to-output transition due to steps (f) through (h) being unable to avoid conflicts.

6. The method of claim 1 wherein the step (f) comprises:

pairing one product term of the Boolean function stored in the product term binary data structure with one product term of the inverse Boolean function stored in the product term binary data structure to result in two modified product terms; and logically ANDing the two modified product terms together to form one Boolean difference product term in the Boolean difference set.

7. The method of claim 1 wherein the selected path is being tested using a predetermined input-to-output transition and where the method further comprises:

selectively storing, in the fixed amount of memory, only those Boolean differences which are in accordance with the predetermined input-to-output transition.

8. The method of claim 1 wherein the selected path is being tested using a predetermined input-to-output transition and the predetermined input-to-output transition is a transition selected from a group consisting of: input rising/output rising, input rising/output falling, input falling/output rising, input falling/output falling.

9. The method of claim 1 wherein the custom logic block has a plurality of outputs wherein each output in the plurality of outputs is defined by a distinct Boolean function in step (c).

10. The method of claim 1 wherein the custom logic block either is connected directly in the selected path or affects a logic signal on the selected path.

11. The method of claim 1 further comprising the step of:

manufacturing a plurality of circuits, each circuit in the plurality of circuits being in accordance with the electrical circuit, and testing each circuit in the plurality of circuits using the test vector generated in step (j).

12. A method for processing a logic circuit model to allow for testing of a logic circuit coupled in accordance with the logic circuit model, the method comprising the steps of:

parsing the logic circuit model to identify at least one output statement of the logic circuit model wherein the at least one output statement indicates a binary logic output of the logic circuit model as a function of a plurality of Boolean variables wherein the plurality of Boolean variables are logically manipulated by at least one logical operator to form at least one product term;

building, via the at least one output statement, a product term data structure for both the at least one output statement and an inverse function of the at least one output statement wherein the product term data structure is a binary bit array which identifies the plurality of Boolean variables and how the plurality of Boolean variables are interrelated to form product terms in both the at least one output statement and an inverse function of the at least one output statement;

storing in memory a Boolean difference set, the Boolean difference set selectively storing a plurality of Boolean differences, which are in accordance with a predetermined test condition, wherein a Boolean difference is formed by logically combining a product term from the product term data structure which corresponds to the at least one output statement and a product term from the product term data structure which corresponds to the inverse function of the at least one output statement; and using the Boolean difference set to allow for testing of the logic circuit.

13. The method of claim 12 wherein the logic circuit model is a module of a larger circuit and the step of using the Boolean difference set to allow for testing of the logic circuit comprises:

selecting a logic path in the larger circuit which is affected by the logic circuit model; and iteratively determining logic values along the logic path to be in accordance with the predetermined test condition.

14. The method of claim 13 wherein the step of iteratively determining logic values comprises:

determining if the use of the Boolean difference set creates a conflict, wherein the conflict is defined as being a condition wherein logic values required from the Boolean difference set to allow for testing of the logic circuit is not in agreement with logic values previously defined along the logic path to allow for testing of the logic circuit.

15. The method of claim 14 further comprising:

discarding the Boolean difference set which resulted in the conflict if no Boolean difference in the Boolean difference set can be used conflict-free; and generating a new Boolean difference set to further process to allow for testing of the logic circuit.

16. The method of claim 14 further comprising:

discarding the Boolean difference set which resulted in the conflict if no Boolean difference in the Boolean difference set can be used conflict-free; and iteratively generating new Boolean difference sets to further process to allow for testing of the logic circuit until no conflict occurs.

17. The method of claim 16 further comprising:

identifying the logic path as being untestable if no Boolean difference which is in accordance with the test condition can be used in a conflict-free manner.

18. A data processing system comprising:

a central processing unit (CPU);

a memory system coupled to the CPU by a bus wherein the memory system stores a plurality of binary values wherein the plurality of binary values are accessed and executed by the CPU to selectively store Boolean differences, the Boolean differences being calculated by logically combining product terms of a function data structure and an inverse function data structure, the function data structure defining an electrical signal path in an electrical circuit model which is stored in the memory system and the inverse function data structure model inversely defining the electrical signal path in an electrical circuit model, the Boolean differences are stored in a fixed amount of memory wherein the Boolean differences which are stored in the fixed amount of memory are in accordance with a predetermined test constraint associated with the electrical signal path wherein all other Boolean differences not being in accordance with the predetermined test constraint are not stored in the fixed amount of memory, the predetermined test constraint being a plurality of input electrical signals within the electrical model which affect the operation of the electrical signal path.

19. A Boolean difference generator comprising:

means for parsing a logic circuit model to identify at least one output statement of the logic circuit model wherein the at least one output statement indicates a binary logic output of the logic circuit model as a function of a plurality of Boolean variables wherein the plurality of Boolean variables are logically manipulated by at least one logical operator to form at least one product term;

means for building, via the at least one output statement, a product term data structure for both the at least one output statement and an inverse function of the at least one output statement wherein the product term data structure is a binary bit array which identifies the plurality of Boolean variables and how the plurality of Boolean variables are interrelated to form product terms in both the at least one output statement and an inverse function of the at least one output statement;

means for storing in memory a Boolean difference set, the Boolean difference set selectively storing a plurality of Boolean differences, which are in accordance with a predetermined test condition;, wherein a Boolean difference is formed by logically combining a product term from the product term data structure which corresponds to the at least one output statement and a product term from the product term data structure which corresponds to the inverse function of the at least one output statement; and means for accessing the Boolean difference set to aid in testing of the logic circuit.

20. The Boolean difference generator of claim 19 wherein the means for building generates a new Boolean difference set in order to replace the Boolean difference set in response to a data conflict, if all of the Boolean differences within the Boolean difference set creates the data conflict.

21. The Boolean difference generator of claim 20 wherein the means for building creates a Boolean difference within the new Boolean difference set by (a) clearing the Boolean difference terms out of the Boolean difference set; (b) pairing a product term from the product term data structure which corresponds to an output function and a product term from the product term data structure which corresponds to an inverse of the output function; (c) removing an on-path input from the product terms paired in step (b) to form resulting terms; (d) logically ANDing the resulting terms from step (c), to create a Boolean difference; and (e) repeating steps (b) through (d) until a predetermined number of Boolean differences is generated.

22. The Boolean difference generator of claim 19 wherein the means for storing the Boolean differences in a Boolean difference set stores the Boolean differences within a fixed amount of memory.

23. A method for processing a logic circuit model to allow for testing of a logic circuit coupled in accordance with the logic circuit model, the method comprising the steps of:
  (a) determining a logic path in the logic circuit model which is to be tested for a predetermined logical transition;
  (b) representing the logic path in the logic circuit model as a Boolean function having input variables arranged in product terms and logical operators to operate on the product terms;
  (c) representing the inverse Boolean function of the Boolean function wherein the inverse Boolean function contains inverse product terms;
  (d) defining a set of product terms containing some product terms and some inverse product terms and manipulating the set of product terms to determine if the set of product terms can generate the predetermined logical transition in order to allow testing of the logic path; and
  (e) changing, when the predetermined logical transition cannot be generated in step (d), the set of product terms to contain other inverse product terms and other product terms different from the some inverse product terms and some product terms used in step (d), and performing steps (d)–(e) until the predetermined logical transition can be attained or the product terms and inverse product terms have been exhausted.

24. The method of claim 23 wherein the step (e) comprises:
  identifying the logic path as untestable when the product terms and inverse product terms have been exhausted and the predetermined logical transition cannot be attained.

25. The method of claim 23 further comprising a step of:
  (f) manufacturing a plurality of logic circuits coupled in accordance with the logic circuit model and testing the plurality of logic circuits via test vectors generated from information gathered in steps (a) through (e).

26. A method for processing a logic circuit model to allow for testing of a logic circuit coupled in accordance with the logic circuit model, the method comprising the steps of:
  (a) determining a logic path in the logic circuit model which is to be tested for a predetermined logical transition;
  (b) representing the logic path in the logic circuit model as a Boolean function having input variables arranged in product terms and logical operators to operate on the product terms;
  (c) representing the inverse Boolean function of the Boolean function wherein the inverse Boolean function contains inverse product terms;
  (d) using the inverse product terms and the product terms to store a plurality of Boolean differences;
  (e) verifying whether any of the Boolean differences enable the predetermined logic transition by comparing the Boolean differences to predetermined logical constraints; and
  (f) selecting one of the Boolean differences as a selected logic constraint when the step (e) verifies that the one of the Boolean differences enables the predetermined logic transition, or else performing steps (d) through (e) to find a plurality of different Boolean differences to analyze until either all product terms and inverse product terms are exhausted or the selected logic constraint is determined.

* * * * *